(12) United States Patent
Beaman et al.

(10) Patent No.: US 7,538,565 B1
(45) Date of Patent: May 26, 2009

(54) HIGH DENSITY INTEGRATED CIRCUIT APPARATUS, TEST PROBE AND METHODS OF USE THEREOF

(75) Inventors: Brian Samuel Beaman, Hyde Park, NY (US); Keith Edward Fogel, Bardonia, NY (US); Paul Alfred Lauro, Nanuet, NY (US); Maurice Heathcote Norcott, Valley Cottage, NY (US); Da-Yuan Shih, Poughkeepsie, NY (US); George Frederick Walker, New York, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/382,834

(22) Filed: Aug. 25, 1999

Related U.S. Application Data

(60) Continuation of application No. 08/872,519, filed on Jun. 11, 1997, now Pat. No. 6,334,247, which is a division of application No. 08/754,869, filed on Nov. 22, 1996, now Pat. No. 5,821,763, which is a continuation of application No. 08/055,485, filed on Apr. 30, 1993, now Pat. No. 5,635,846, which is a continuation-in-part of application No. 07/963,346, filed on Oct. 19, 1992, now Pat. No. 5,371,654.

(51) Int. Cl.
*G01R 31/02* (2006.01)
(52) U.S. Cl. ................................. 324/754; 324/761
(58) Field of Classification Search ......... 324/754–762, 324/765; 439/482, 824; 29/628, 874, 840
See application file for complete search history.

(56) References Cited

U.S. PATENT DOCUMENTS 3,541,222 A 11/1970 Parks et al.

(Continued)

FOREIGN PATENT DOCUMENTS

| JP | 45-29855 | * 9/1970 | .................. 29/827 |
| JP | 2-290564 | * 11/1990 | |
| SU | 1003396 | 8/1980 | |
| WO | WO 96/15458 | 5/1996 | |

OTHER PUBLICATIONS

IBM Tech. Discl. Bull. vol. 15 No. 11 (Apr. 1973) pp. 3428-3429 by B. Best et al, Apr. 1973.*

(Continued)

*Primary Examiner*—Vinh P Nguyen
(74) *Attorney, Agent, or Firm*—Daniel P. Morris

(57) ABSTRACT

A high density test probe which provides an apparatus for testing a high density and high performance integrated circuits in wafer form or as discrete chips. The test probe is formed from a dense array of elongated electrical conductors which are embedded in an compliant or high modulus elastomeric material. A standard packaging substrate, such as a ceramic integrated circuit chip packaging substrate is used to provide a space transformer. Wires are bonded to an array of contact pads on the surface of the space transformer. The space transformer formed from a multilayer integrated circuit chip packaging substrate. The wires are as dense as the contact location array. A mold is disposed surrounding the array of outwardly projecting wires. A liquid elastomer is disposed in the mold to fill the spaces between the wires. The elastomer is cured and the mold is removed, leaving an array of wires disposed in the elastomer and in electrical contact with the space transformer. The space transformer can have an array of pins which are on the opposite surface of the space transformer opposite to that on which the elongated conductors are bonded. The pins are inserted into a socket on a second space transformer, such as a printed circuit board to form a probe assembly. Alternatively, an interposer electrical connector can be disposed between the first and second space transformer.

40 Claims, 21 Drawing Sheets

U.S. PATENT DOCUMENTS

| | | | | |
|---|---|---|---|---|
| 3,795,037 | A * | 3/1974 | Luttmer | 29/628 |
| 3,862,790 | A | 1/1975 | Davies et al. | 339/17 |
| 3,911,361 | A * | 10/1975 | Bove et al. | 324/72.5 |
| 3,954,317 | A | 5/1976 | Gilissen et al. | 339/17 |
| 3,963,986 | A * | 6/1976 | Morton et al. | 324/761 |
| 4,003,621 | A | 1/1977 | Lamp | 339/59 |
| 4,008,300 | A | 2/1977 | Ponn | 264/104 |
| 4,038,599 | A * | 7/1977 | Bove et al. | 324/754 |
| 4,118,092 | A | 10/1978 | Sado et al. | 339/59 |
| 4,203,203 | A | 5/1980 | Gilissen et al. | 29/846 |
| 4,221,047 | A * | 9/1980 | Narken et al. | 29/840 |
| 4,295,700 | A | 10/1981 | Sado | 339/59 |
| 4,355,199 | A | 10/1982 | Luc | 174/68.5 |
| 4,400,234 | A | 8/1983 | Berg | 156/634 |
| 4,402,562 | A | 9/1983 | Sado | 339/61 |
| 4,408,814 | A | 10/1983 | Takashi et al. | 339/59 |
| 4,509,099 | A | 4/1985 | Takamatsu et al. | 361/413 |
| 4,520,562 | A | 6/1985 | Sado et al. | 29/878 |
| 4,548,451 | A | 10/1985 | Benarr et al. | 339/17 |
| 4,555,523 | A | 11/1985 | Hall et al. | 514/469 |
| 4,575,166 | A | 3/1986 | Kasdagly et al. | 339/17 |
| 4,577,918 | A | 3/1986 | Kasdagly | 339/17 |
| 4,585,727 | A * | 4/1986 | Reams | |
| 4,622,514 | A * | 11/1986 | Lewis | 324/761 |
| 4,663,742 | A | 5/1987 | Andersen et al. | 365/189 |
| 4,778,950 | A | 10/1988 | Lee et al. | 174/356 |
| 4,793,814 | A * | 12/1988 | Zifcak et al. | 439/66 |
| 4,811,296 | A | 3/1989 | Garde | 365/189 |
| 4,816,754 | A * | 3/1989 | Buechele et al. | 324/158 F |
| 4,820,170 | A | 4/1989 | Redmond et al. | 439/66 |
| 4,820,376 | A | 4/1989 | Lambert et al. | 156/643 |
| 4,832,609 | A | 5/1989 | Chung | 439/67 |
| 4,875,614 | A * | 10/1989 | Cipolla et al. | 228/5.5 |
| 4,955,523 | A * | 9/1990 | Carlommagno et al. | |
| 4,991,290 | A | 2/1991 | MacKay | |
| 4,998,885 | A * | 3/1991 | Beaman | 439/66 |
| 5,037,312 | A | 8/1991 | Casciotti et al. | 439/66 |
| 5,049,084 | A | 9/1991 | Bakke | 439/66 |
| 5,099,309 | A | 3/1992 | Kryzaniwsky | 357/75 |
| 5,132,613 | A * | 7/1992 | Papae et al. | 324/73.1 |
| 5,148,103 | A | 9/1992 | Pasiecznik, Jr. | 324/158 |
| 5,195,237 | A * | 3/1993 | Cray et al. | 29/843 K |
| 5,258,236 | A * | 11/1993 | Arjavalingam et al. | 428/626 |
| 5,371,654 | A * | 12/1994 | Beaman et al. | 361/761 |
| 5,476,211 | A * | 12/1995 | Khandros | |
| 5,635,846 | A * | 6/1997 | Beaman et al. | 324/754 |

OTHER PUBLICATIONS

"Shaped Elastomeric Interposer for Large Area Array Connectors", Disclosed Anonymously, Research Disclosure, Apr. 1991, No. 32490, Kenneth Mason Publications, Ltd., England, p. 278.

"Elastomeric Interposer Using Wires In Elastomer Pad With Controlled Compliance" Disclosed Anonymously, Research Disclosure; Apr. 1991, No. 32492, Kenneth Mason Publications, Ltd., England, p. 279.

"Elastomeric Interposer Using Film Supported Metal Conductors" Disclosed Anonymously, Research Disclosure, Apr. 1991, No. 32491, Kenneth Mason Publications, Ltd., England, p. 278.

"High Density Area Array Connector" Disclosed Anonymously, Research Disclosure, Apr. 1991, No. 32486, Kenneth Mason Publications, Ltd., England, p. 275.

IBM Technical Disclosure Bullentin vol. 15 No. 11 (Apr. 1973) pp. 3428-3429 by B. Best et al.

* cited by examiner

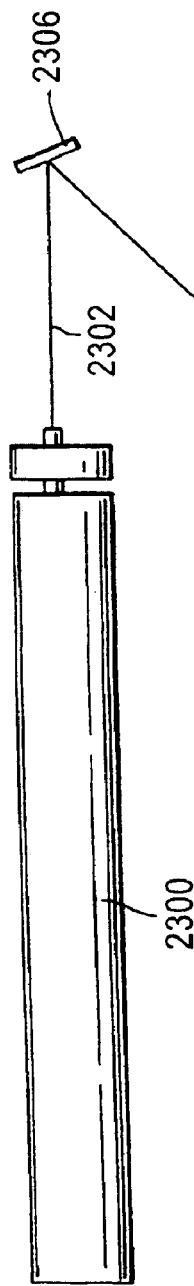
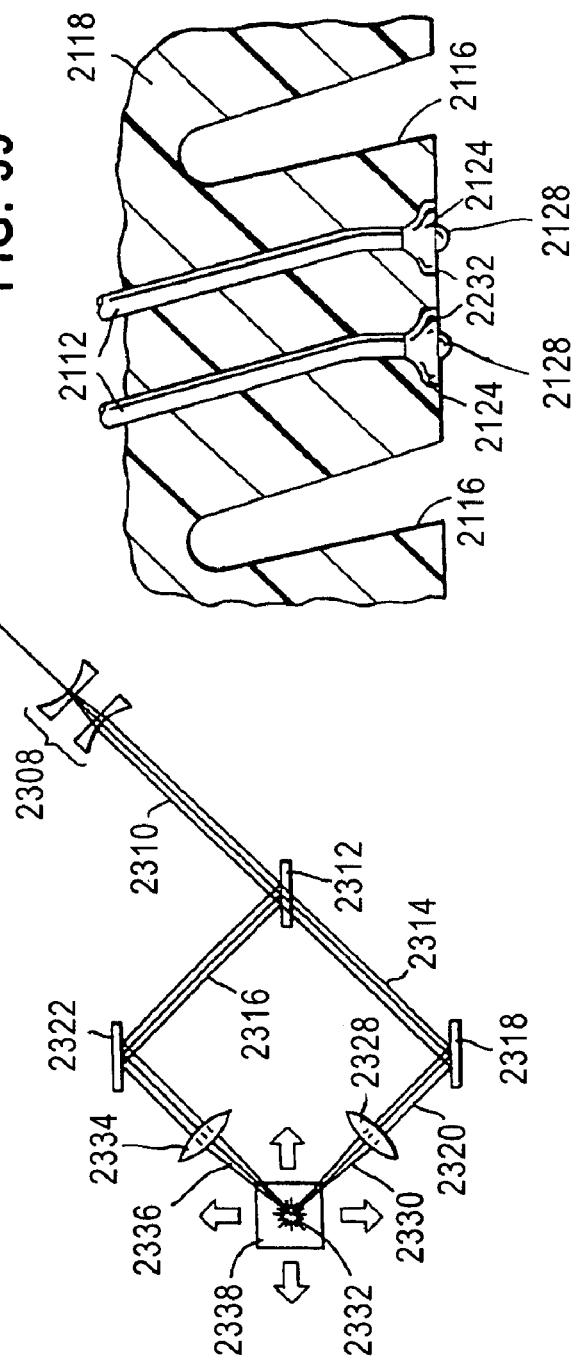
FIG. 38
FIG. 39

HIGH DENSITY INTEGRATED CIRCUIT APPARATUS, TEST PROBE AND METHODS OF USE THEREOF

This is a continuation of application Ser. No. 08/872,519 filed on Jun. 11, 1997, issued as U.S. Pat. No. 6,334,247, which is a division of application Ser. No. 08/754,869 filed on Nov. 22, 1996, now issued as U.S. Pat. No. 5,821,763 which is a continuation of application Ser. No. 08/055,485 filed on Apr. 30, 1993, now issued as U.S. Pat. No. 5,635,846 which is a Continuation-in-part of application Ser. No. 07/963,346 filed on Oct. 19, 1992 now issued as U.S. Pat. No. 5,371,654.

FIELD OF THE INVENTION

This invention relates to an apparatus and test probe for integrated circuit devices and methods of use thereof.

BACKGROUND OF THE INVENTION

In the microelectronics industry, before integrated circuit (IC) chips are packaged in an electronic component, such as a computer, they are tested. Testing is essential to determine whether the integrated circuit's electrical characteristics conform to the specifications to which they were designed to ensure that electronic component performs the function for which it was designed.

Testing is an expensive part of the fabrication process of contemporary computing systems. The functionality of every I/O for contemporary integrated circuit must be tested since a failure to achieve the design specification at a single I/O can render an integrated circuit unusable for a specific application. The testing is commonly done both at room temperature and at elevated temperature to test functionality and at elevated temperatures with forced voltages and currents to burn the chips in and to test the reliability of the integrated circuit to screen out early failures.

Contemporary probes for integrated circuits are expensive to fabricate and are easily damaged. Contemporary test probes are typically fabricated on a support substrate from groups of elongated metal conductors which fan inwardly towards a central location where each conductor has an end which corresponds to a contact location on the integrated circuit chip to be tested. The metal conductors generally cantilever over an aperture in the support substrate. The wires are generally fragile and easily damage and are easily displaceable from the predetermined positions corresponding to the design positions of the contact locations on the integrated circuit being tested. These probes last only a certain number of testing operations, after which they must be replaced by an expensive replacement or reworked to recondition the probes.

FIG. 1 shows a side cross-sectional view of a prior art probe assembly 2 for probing integrated circuit chip 4 which is disposed on surface 6 of support member 8 for integrated circuit chip 4. Probe assembly 2 consists of a dielectric substrate 10 having a central aperture 12 therethrough. On surface 14 of substrate 10 there are disposed a plurality of electrically conducting beams which extend towards edge 18 of aperture 12. Conductors 16 have ends 20 which bend downwardly in a direction generally perpendicular to the plane of surface 14 of substrate 10. Tips 22 of downwardly projecting electrically conducting ends 20 are disposed in electrical contact with contact locations 24 on surface 25 of integrated circuit chip 4. Coaxial cables 26 bring electrical signals, power and ground through electrical connectors 28 at periphery 30 of substrate 10. Structure 2 of FIG. 1 has the disadvantage of being expensive to fabricate and of having fragile inner ends 20 of electrical conductors 16. Ends 20 are easily damaged through use in probing electronic devices. Since the probe 2 is expensive to fabricate, replacement adds a substantial cost to the testing of integrated circuit devices. Conductors 16 were generally made of a high strength metal such as tungsten to resist damage from use. Tungsten has an undesirably high resistivity.

SUMMARY OF THE INVENTION

It is an object of the present invention to provide an improved high density test probe, test apparatus and method of use thereof.

It is another object of the present invention to provide an improved test probe for testing and burning-in integrated circuits.

It is another object of the present invention to provide an improved test probe and apparatus for testing integrated circuits in wafer form and as discrete integrated circuit chips.

It is an additional object of the present invention to provide probes having contacts which can be designed for high performance functional testing and for high temperature burn in applications.

It is yet another object of the present invention to provide probes having contacts which can be reworked several times by resurfacing some of the materials used to fabricate the probe of the present invention.

It is a further object of the present invention to provide an improved test probe having a probe tip member containing a plurality of elongated conductors each ball bonded to electrical contact locations on space transformation substrate.

A broad aspect of the present invention is a test probe having a plurality of electrically conducting elongated members embedded in a material. One end of each conductor is arranged for alignment with contact locations on a workpiece to be tested.

In a more particular aspect of the present invention, the other end of the elongated conductors are electrically connected to contact locations on the surface of a fan-out substrate. The fan-out substrate provides space transformation of the closely spaced electrical contacts on the first side of the fan-out substrate. Contact locations having a larger spacing are on a second side of the fan out substrate.

In yet another more particular aspect of the present invention, pins are electrically connected to the contact locations on the second surface of the fan out substrate.

In another more particular aspect of the present invention, the plurality of pins on the second surface of the fan-out substrate are inserted into a socket on a second fan-out substrate. The first and second space transformation substrates provide fan out from the fine pitch of the integrated circuit I/O to a larger pitch of electrical contacts for providing signal, power and ground to the workpiece to be tested.

In another more particular aspect of the present invention, the pin and socket assembly is replaced by an interposer containing a plurality of elongated electrical connectors embedded in a layer of material which is squeezed between contact locations on the first fan-out substrate and contact locations on the second fan-out substrate.

In another more particular aspect of the present invention, the test probe is part of a test apparatus and test tool.

Another broad aspect of the present invention is a method of fabricating the probe tip of the probe according to the present invention wherein a plurality of elongated conductors are bonded to contact locations on a substrate surface and project away therefrom.

In a more particular aspect of the method according to the present invention, the elongated conductors are wire bonded to contact locations on the substrate surface. The wires project preferably at a nonorthogonal angle from the contact locations.

In another more particular aspect of the method of the present invention, the wires are bonded to the contact locations on the substrate are embedded in a elastomeric material to form a probe tip for the structure of the present invention.

In another more particular aspect of the present invention, the elongated conductors are embedded in an elastomeric material.

BRIEF DESCRIPTION OF THE DRAWINGS

FIG. 38 is an enlarged view of the region of FIG. 23 enclosed in dashed circle 2230.

FIG. 39 schematically shows an optical system to form balls on the end of the wire conductors in FIG. 31.

DETAILED DESCRIPTION

Figure 1:
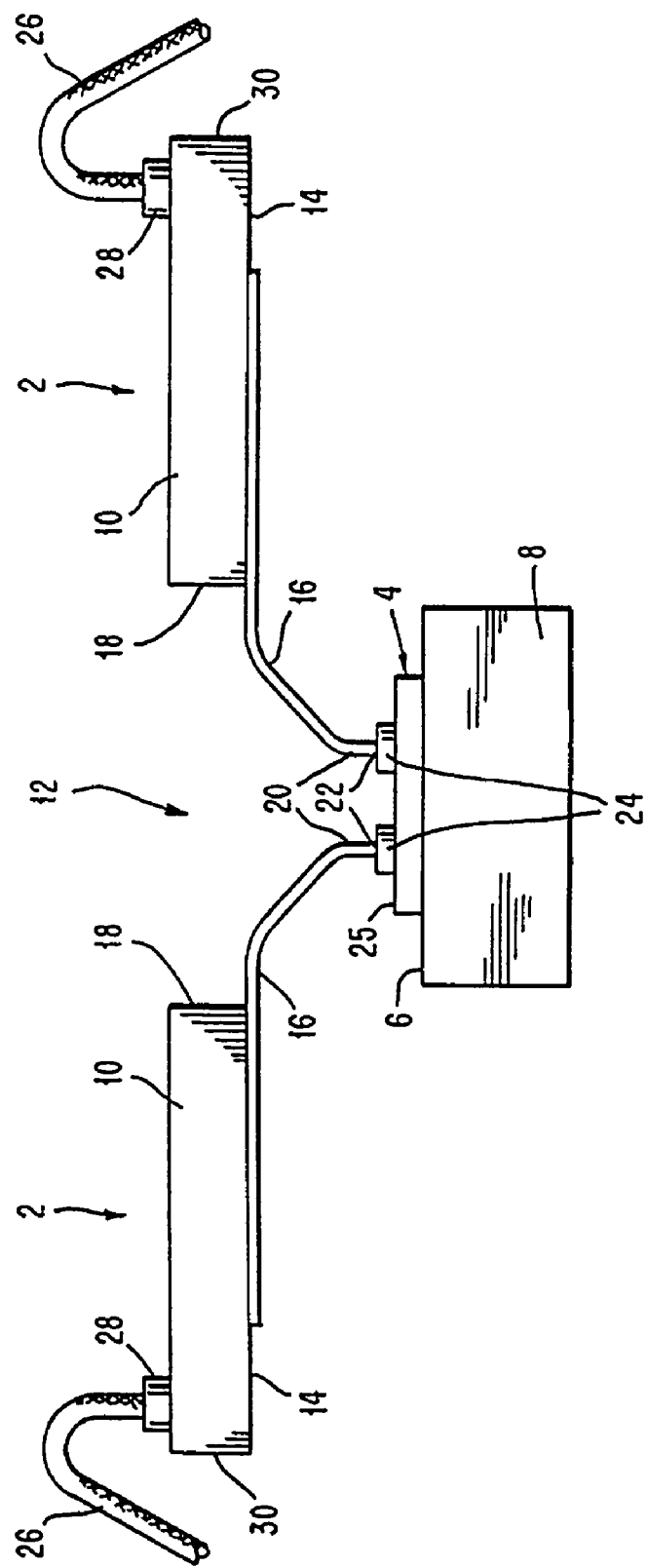
FIG. 1 is a schematic cross-section of a conventional test probe for an integrated circuit device.
Figure 2:
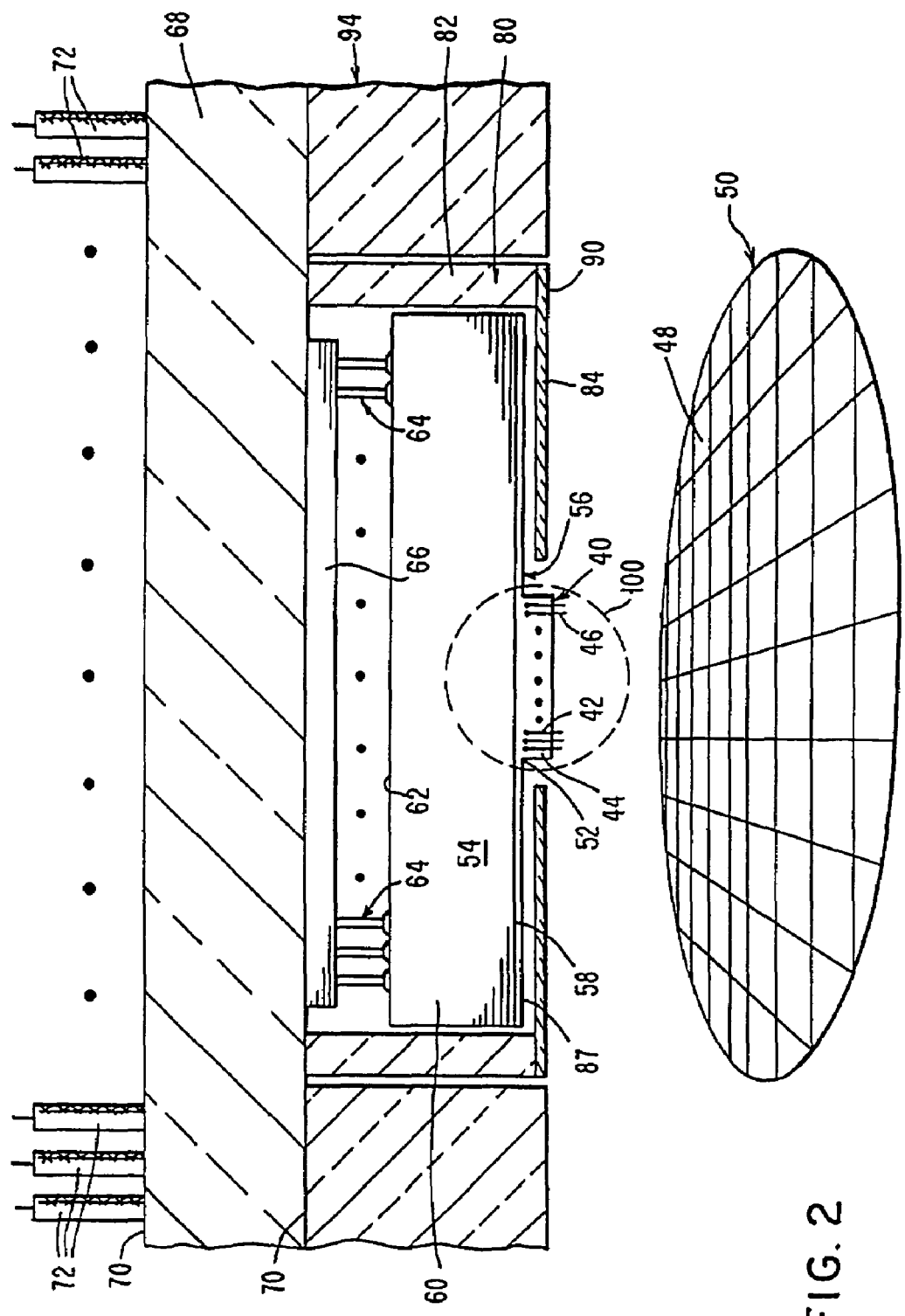
FIG. 2 is a schematic diagram of one embodiment of the probe structure of the present invention.
Figure 3:
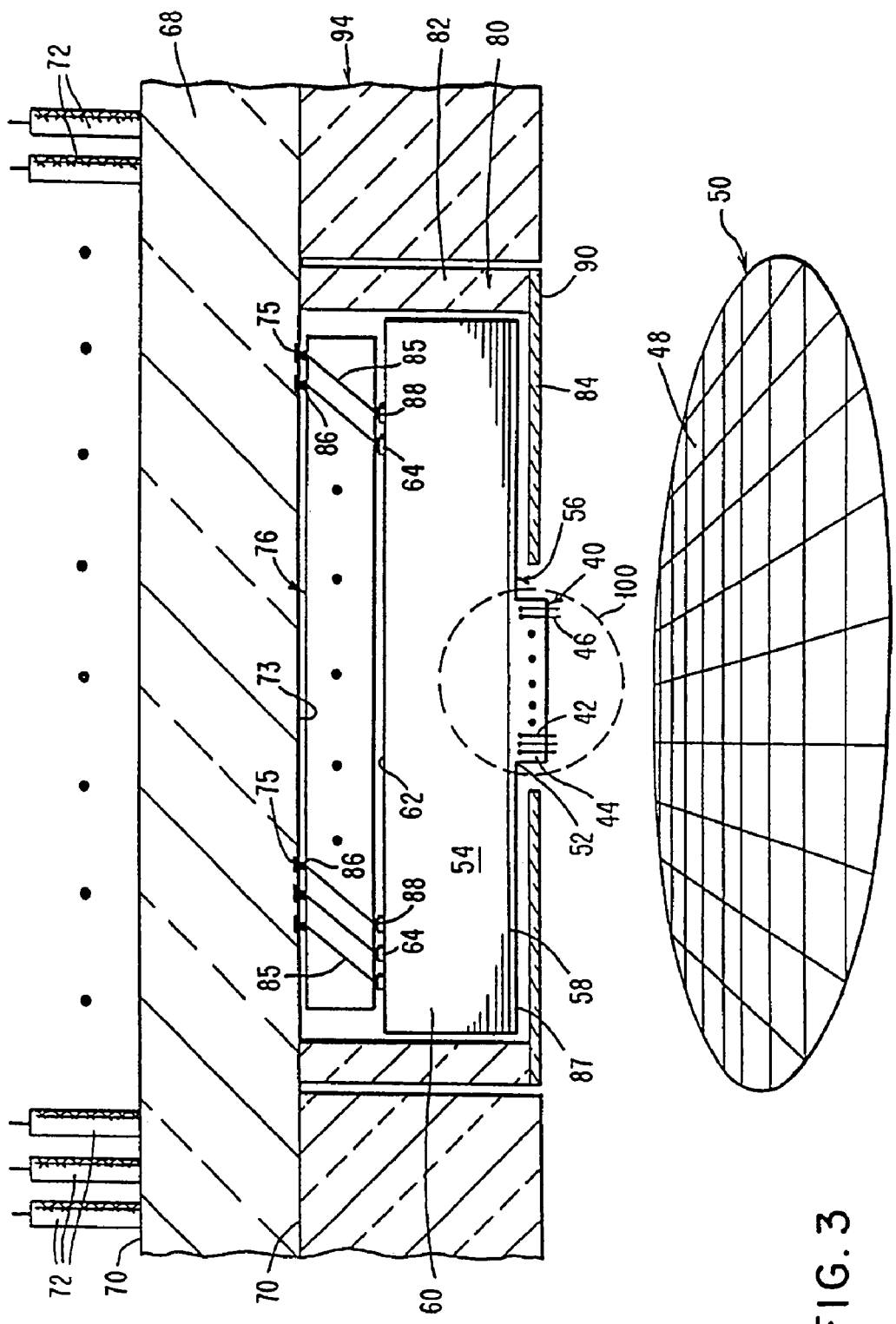
FIG. 3 is a schematic diagram of another embodiment of the probe structure of the present invention.

Turning now to the figures, FIGS. 2 and 3 show two embodiments of the test assembly according to the present invention. Numerals common between FIGS. 2 and 3 represent the same thing. Probe head 40 is formed from a plurality of elongated electrically conducting members 42 embedded in a material 44 which is preferably an elastomeric material 44. The elongated conducting members 42 have ends 46 for probing contact locations on integrated circuit devices 48 of wafer 50. In the preferred embodiment, the workpiece is an integrated circuit such as a semiconductor chip or a semiconductor wafer having a plurality of chips. The workpiece can be any other electronic device. The opposite ends 52 of elongated electrical conductors 42 are in electrical contact with space transformer (or fan-out substrate) 54. In the preferred embodiment, space transformer 54 is a multilevel metal/ceramic substrate, a multilevel metal/polymer substrate or a printed circuit board which are typically used as packaging substrates for integrated circuit chips. Space transformer 54 has, in the preferred embodiment, a surface layer 56 comprising a plurality of thin dielectric films, preferably polymer films such as polyimide, and a plurality of layers of electrical conductors, for example, copper conductors. A process for fabricating multilayer structure 56 for disposing it on surface 58 of substrate 60 to form a space transformer 54 is described in U.S. patent application Ser. No. 07/695,368, filed on May 3, 1991, entitled "MULTI-LAYER THIN FILM STRUCTURE AND PARALLEL PROCESSING METHOD FOR FABRICATING SAME" which is assigned to the assignee of the present invention, the teaching of which is incorporated herein by reference. Details of the fabrication of probe head 40 and of the assembly of probe head 40 and 54 will be described herein below.

As shown in FIG. 2, on surface 62 of substrate 60, there are, a plurality of pins 64. Surface 62 is opposite the surface 57 on which probe head 40 is disposed. Pins 64 are standard pins used on integrated circuit chips packaging substrates. Pins 64 are inserted into socket 66 or plated through-holes in the substrate 68 which is disposed on surface 70 of the second space transformer 68. Socket 66 is a type of pin grid array (PGA) socket such as commonly disposed on a printed circuit board of an electronic computer for receiving pins from a packaging substrate. Second space transformer 68 can be any second level integrated circuit packaging substrate, for example, a standard printed circuit board. Socket 66 is disposed on surface 70 of substrate 68. On opposite surface 70 of substrate 68 there are disposed a plurality of electrical connectors to which coaxial cables 72 are electrically connected. Alternatively, socket 68 can be a zero insertion force (ZIF) connector or the socket 68 can be replaced by through-holes in the substrate 68 wherein the through-holes have electrically conductive material surrounding the sidewalls such as a plated through-hole.

In the embodiment of FIG. 3, the pin 64 and socket 66 combination of the embodiment of FIG. 2 is replaced by an interposer, such as, elastomeric connector 76. The structure of elastomeric connector 76 and the process for fabricating elastomeric connector 76 is described in copending U.S. patent application Ser. No. 07/963,386 to B. Beaman et al., filed Oct. 19, 1992, entitled "THREE DIMENSIONAL HIGH PERFORMANCE INTERCONNECTION MEANS" now issued as U.S. Pat. No. 5,371,654, which is assigned to the assignee of the present invention, the teaching of which is incorporated herein by reference and of which the present application is a continuation-in-part thereof, the priority date of the filing thereof being claimed herein. The elastomeric connector can be opted to have one end permanently bonded to the substrate, thus forming a FRU (filed replacement unit) together with the probe/substrate/connector assembly.

Figure 4:
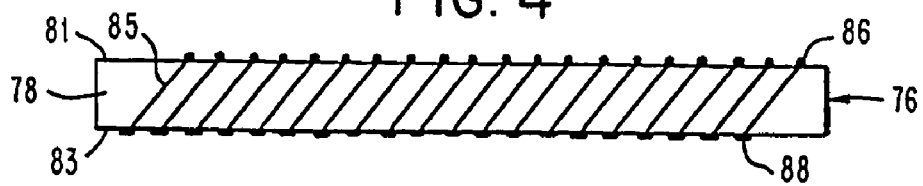
FIG. 4 is an enlarged view of an elastomeric connector electrically interconnecting two space transformation substrates of the structure of FIG. 2.

FIG. 4 shows a cross-sectional view of structure of the elastomeric connector 76 of FIG. 3. Connector 76 is fabricated of preferably elastomeric material 78 having opposing, substantially parallel and planar surfaces 80 and 82. Through elastomeric material 78, extending from surface 81 to 83 there are a plurality of elongated electrical conductors 85. Elongated electrical conductors 84 are preferably at a nonorthogonal angle to surfaces 81 to 83. Elongated conductors 85 are preferably wires which have protuberances 86 at surface 81 of elastomeric material layer 78 and flattened protuberances 88 at surface 83 of elastomeric material layer 78. Flattened protuberances 88 preferably have a projection on the flattened surface as shown for the structure of FIG. 14. Protuberance 86 is preferably spherical and flattened protuberance 88 is preferably a flattened sphere. Connector 76 is squeezed between surface 62 of substrate 54 and surface 73 of substrate 68 to provide electrical connection between end 88 of wires 85 and contact location 75 on surface 73 of substrate 68 and between end 88 or wires 85 and contact location 64 on surface 62 of substrate 54.

Alternatively, as shown in FIG. 3, connector 76 can be rigidly attached to substrate 54 by solder bonding ends 88 of wires 85 to pads 64 on substrate 54 or by wire bonding ends 86 of wires 85 to pads 64 on substrate 54 in the same manner that wires 42 are bonded to pads 106 as described herein below with respect to FIG. 5. Wires 85 can be encased in an elastomeric material in the same manner as wires 42 of FIG. 5.

Space transformer 54 is held in place with respect to second space transformer 68 by clamping arrangement 80 which is comprised of member 82 which is perpendicularly disposed with respect to surface 70 of second space transformer 68 and member 84 which is preferably parallely disposed with respect to surface 86 of first space transformer 54. Member 84 presses against surface 87 of space transformer 54 to hold space transformer 54 in place with respect surface 70 of space transformer 64. Member 82 of clamping arrangement 80 can be held in place with respect to surface 70 by a screw which is inserted through member 84 at location 90 extending through the center of member 82 and screw into surface 70.

The entire assembly of second space transformer 68 and first space transformer with probe head 40 is held in place with respect wafer 50 by assembly holder 94 which is part of an integrated circuit test tool or apparatus. Members 82, 84 and 90 can be made from materials such as aluminum.

Figure 5:
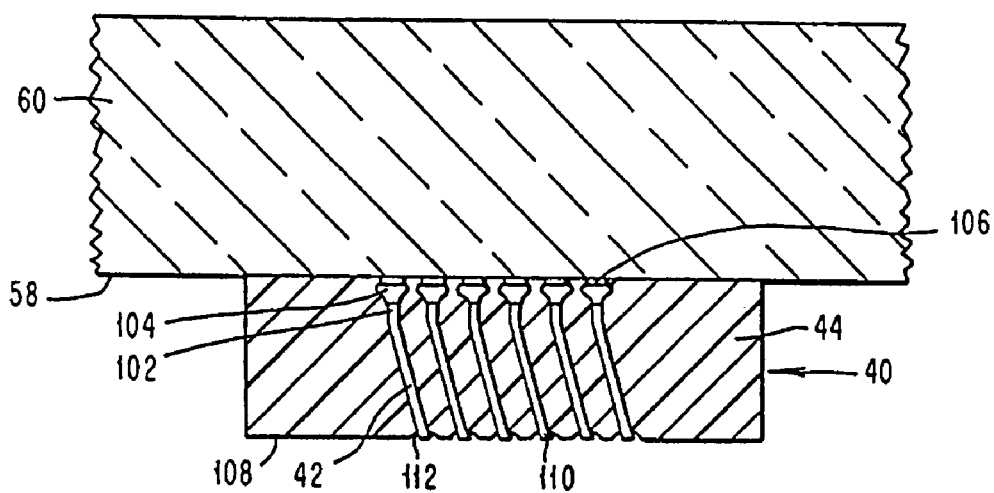
FIG. 5 is an enlarged view of the probe tip within dashed circle 100 of FIG. 2 or 3.

FIG. 5 is a enlarged view of the region of FIG. 2 or 3 closed in dashed circle 100 which shows the attachment of probe head 40 to substrate 60 of space transformer 54. In the preferred embodiment, elongated conductors 42 are preferably wires which are at a non-orthogonal angle with respect to surface 87 of substrate 60. At end 102 of wire 42 there is preferably a flattened protuberance 104 which is bonded (by wire bonding, solder bonding or any other known bonding technique) to electrically conducting pad 106 on surface 87 of substrate 60. Elastomeric material 44 is substantially flush against surface 87. At substantially oppositely disposed planar surface 108 elongated electrically conducting members 42 have an end 110. In the vicinity of end 110, there is optimally a cavity 112 surrounding end 110. The cavity is at surface 108 in the elastomeric material 44.

Figure 6:
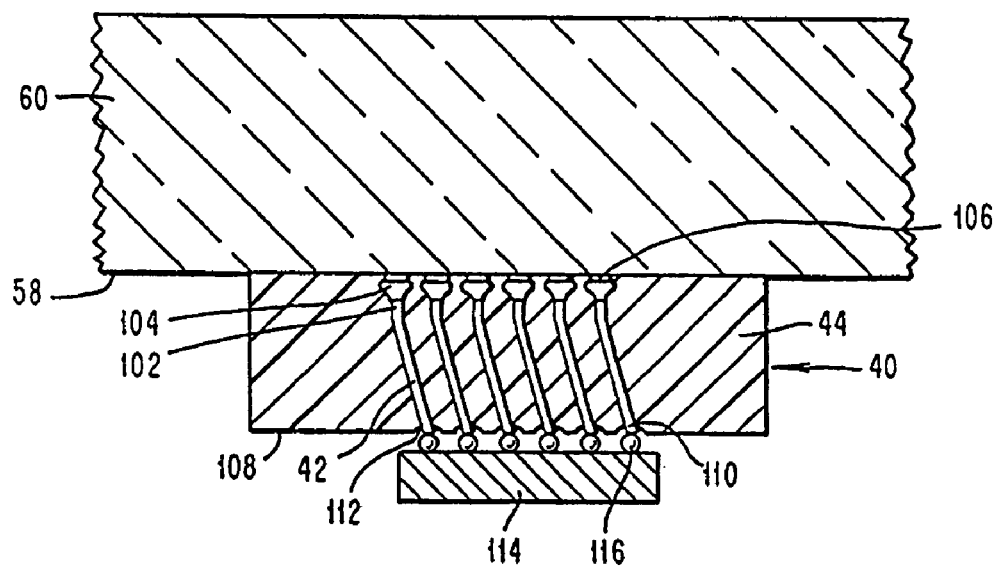
FIG. 6 shows the probe tip of the structure of FIG. 5 probing an integrated circuit device.

FIG. 6 shows the structure of FIG. 5 used to probe integrated circuit chip 114 which has a plurality of contact locations 116 shown as spheres such as a C4 solder balls. The ends 110 of conductors 42 are pressed in contact with contact locations 116 for the purpose of electrically probing integrated circuit 114. Cavity 112 provides an opening in elastomeric material 44 to permit ends 110 to be pressed towards and into solder mounds 116. Cavity 112 provides a means for solder mounds 116 to self align to ends 110 and provides a means containing solder mounds which may melt, seep or be less viscous when the probe is operated at an elevated temperature. When the probe is used to test or burn-in workpieces have flat pads as contact locations the cavities 112 can remain or be eliminated.

Figure 7:
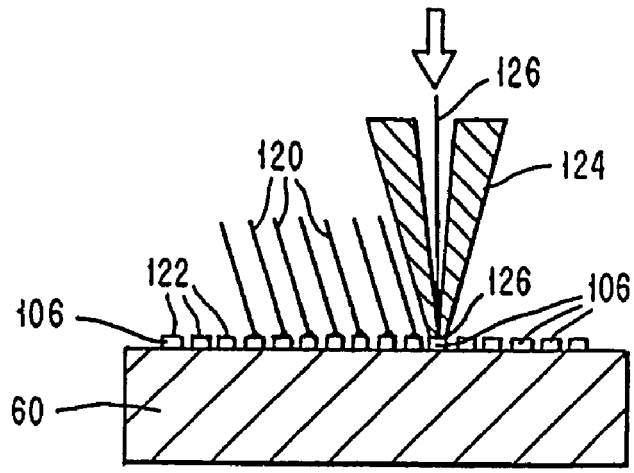
FIGS. 7-12 show the process for making the structure of FIG. 5.

FIGS. 7-13 show the process for fabricating the structure of FIG. 5. Substrate 60 with contact locations 106 thereon is disposed in a wire bond tool. The top surface 122 of pad 106 is coated by a method such as evaporation, sputtering or plating with soft gold or Ni/Au to provide a suitable surface for thermosonic ball bonding. Other bonding techniques can be used such as thermal compression bonding, ultrasonic bonding, laser bonding and the like. A commonly used automatic wire bonder is modified to ball bond gold, gold alloy, copper, copper alloy, aluminum, Pt, nickel or palladium wires 120 to the pad 106 on surface 122 as shown in FIG. 7. The wire preferably has a diameter of 0.001 to 0.005 inches. If a metal other than Au is used, a thin passivation metal such as Au, Cr, Co, Ni, or Pd can be coated over the wire by means of electroplating, or electroless plating, sputtering, e-beam evaporation or any other coating techniques known in the industry. Structure 124 of FIG. 7 is the ball bonding head which has a wire 126 being fed from a reservoir of wire as in a conventional wire bonding apparatus. FIG. 7 shows the ball bond head 124 in contact at location 126 with surface 122 of pad 106.

Figure 8:
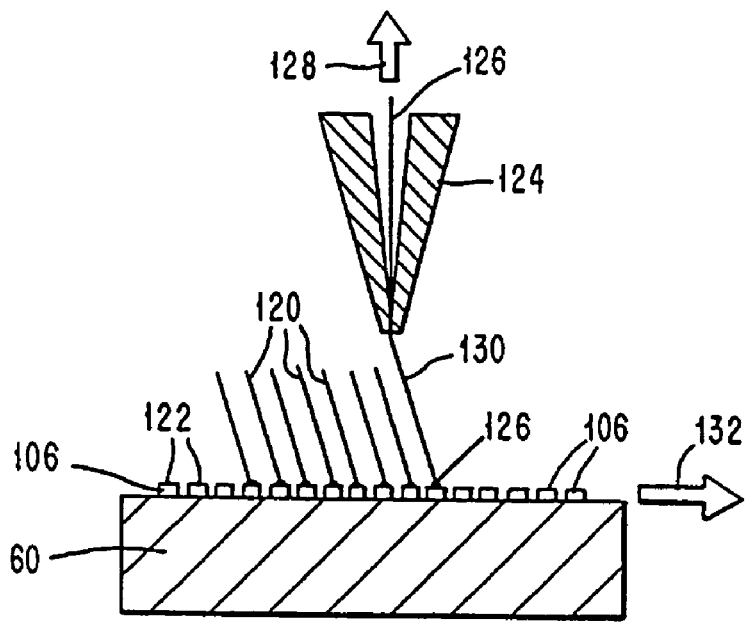
Figure 9:
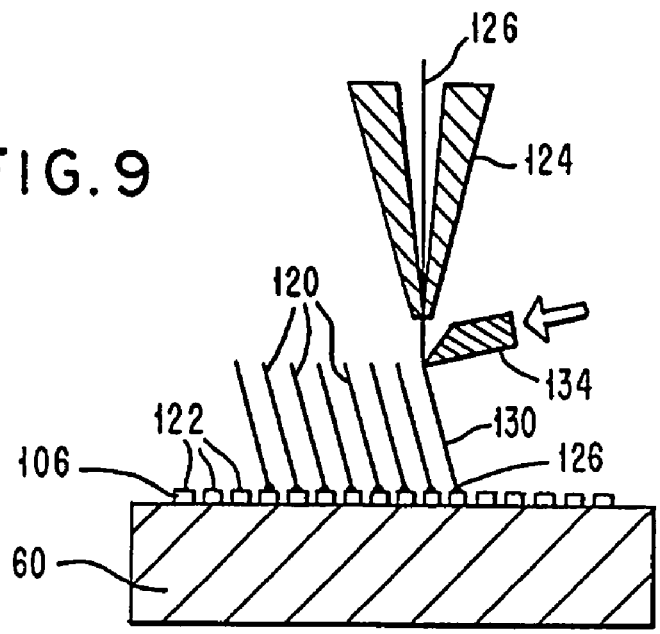

FIG. 8 shows the ball bonding head 124 withdrawn in the direction indicated by arrow 128 from the pad 106 and the wire 126 drawn out to leave disposed on the pad 106 surface 122 wire 130. In the preferred embodiment, the bond head 124 is stationary and the substrate 60 is advanced as indicated by arrow 132. The bond wire is positioned at an angle preferably between 5 to 60° from vertical and then mechanically notched (or nicked) by knife edge 134 as shown in FIG. 9. The knife edge 134 is actuated, the wire 126 is clamped and the bond head 124 is raised. The wire is pulled up and breaks at the notch or nick.

Cutting the wire 130 while it is suspended is not done in conventional wire bonding. In conventional wire bonding, such as that used to fabricate the electrical connector of U.S. Pat. No. 4,998,885, where, as shown in FIG. 8 thereof, one end of a wire is ball bonded using a wire bonded to a contact location on a substrate bent over a loop post and the other of the wire is wedge bonded to an adjacent contact location on the substrate. The loop is severed by a laser as shown in FIG. 6 and the ends melted to form balls. This process results in adjacent contact locations having different types of bonds, one a ball bond the other a wedge bond. The spacing of the adjacent pads cannot be less than about ~20 mils because of the need to bond the wire. This spacing is unacceptable to fabricate a high density probe tip since dense integrated circuits have pad spacing less than this amount. In contradistinction, according to the present invention, each wire is ball bonded to adjacent contact locations which can be spaced less than 5 mils apart. The wire is held tight and knife edge 134 notches the wire leaving upstanding or flying leads 120 bonded to contact locations 106 in a dense array.

When the wire 130 is severed there is left on the surface 122 of pad 106 an angled flying lead 120 which is bonded to surface 122 at one end and the other end projects outwardly away from the surface. A ball can be formed on the end of the wire 130 which is not bonded to surface 122 using a laser or electrical discharge to melt the end of the wire. Techniques for this are described in co-pending U.S. patent application Ser. No. 07/963,346, filed Oct. 19, 1992, (U.S. Pat. No. 5,371,654) which is incorporated herein by reference above.

Figure 10:
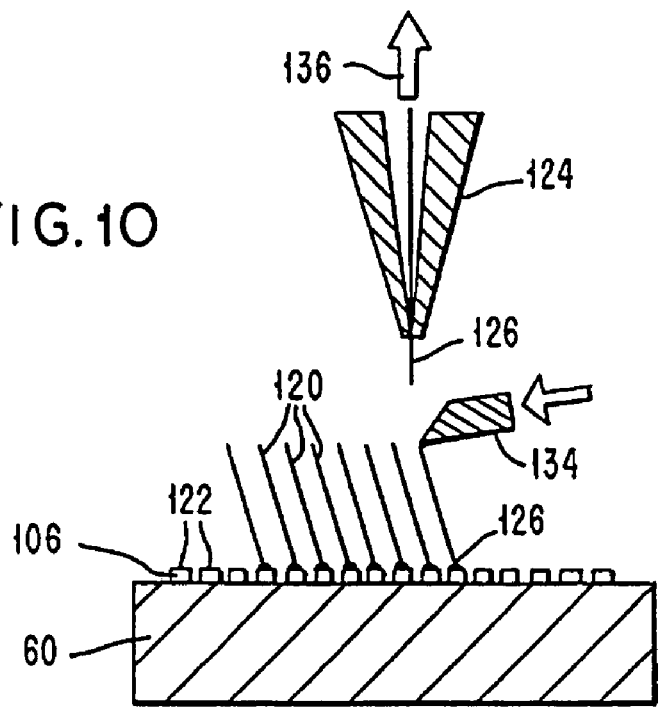

FIG. 10 shows the wire 126 notched (or nicked) to leave wire 120 disposed on surface 122 of pad 106. The wire bond head 124 is retracted upwardly as indicated by arrow 136. The wire bond head 124 has a mechanism to grip and release wire 126 so that wire 126 can be tensioned against the shear blade to sever the wire.

Figure 11:
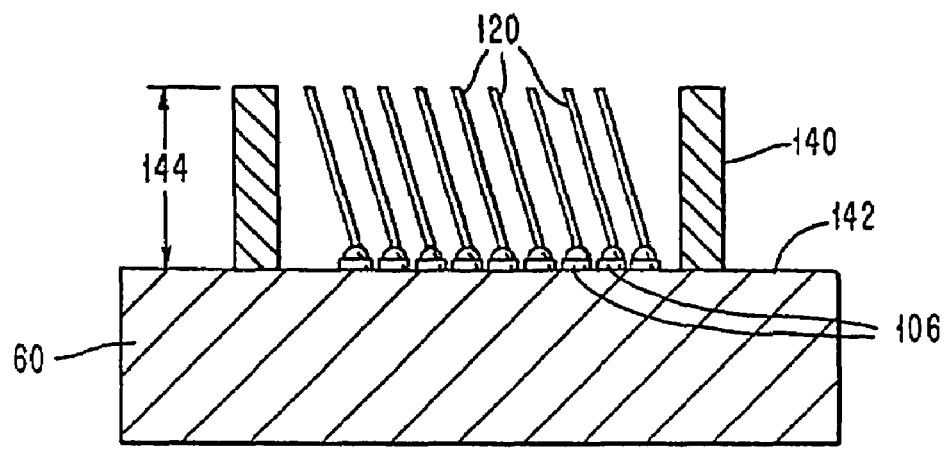
Figure 12:
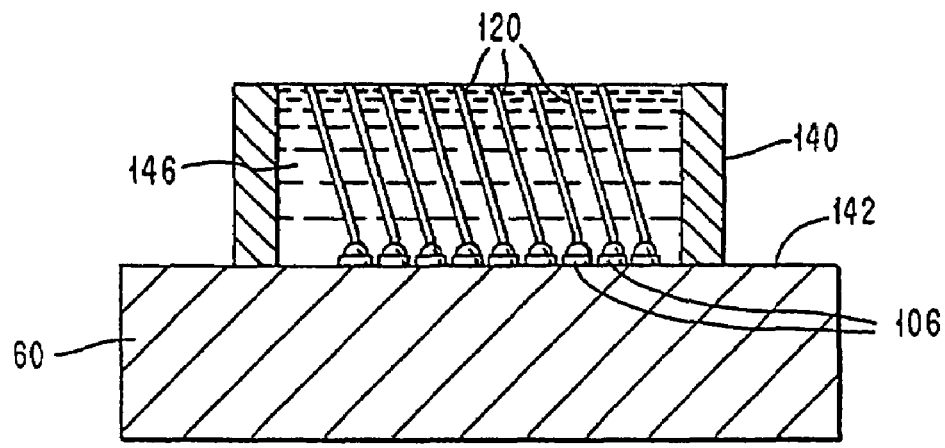
Figure 13:
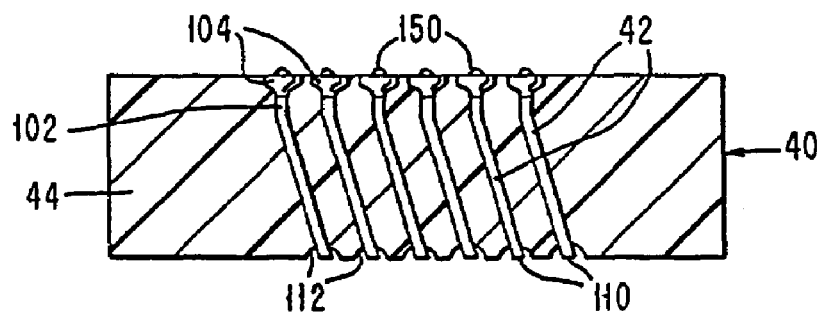
FIG. 13 shows a probe tip structure without a fan-out substrate.

After the wire bonding process is completed, a casting mold 140 as shown in FIG. 11 is disposed on surface 142 of substrate 60. The mold is a tubular member of any cross-sectional shape, such as circular and polygonal. The mold is preferably made of metal or organic materials. The length of the mold is preferably the height 144 of the wires 120. A controlled volume of liquid elastomer 146 is disposed into the casting 140 mold and allowed to settle out (flow between the wires until the surface is level) before curing as shown in FIG. 13. Once the elastomer has cured, the mold is removed to provide the structure shown in FIG. 5 except for cavities 112. The cured elastomer is represented by reference numeral 44. A mold enclosing the wires 120 can be used so that the liquid elastomer can be injection molded to encase the wires 120.

The top surface of the composite polymer/wire block can be mechanically planarized to provide a uniform wire height and smooth polymer surface. A moly mask with holes located over the ends of the wire contacts is used to selectively ablate (or reactive ion etch) a cup shaped recess in the top surface of the polymer around each of the wires. The probe contacts can be reworked by repeating the last two process steps.

A high compliance, high thermal stability siloxane elastomer material is preferable for this application. The compliance of the cured elastomer is selected for the probe application. Where solder mounds are probed a more rigid elastomeric is used so that the probe tips are pushed into the solder mounds where a gold coated aluminum pad is being probed a more compliant elastomeric material is used to permit the wires to flex under pressure so that the probe ends in contact with the pad will move to wipe over the pad so that good electrical contact is made therewith. The high temperature siloxane material is cast or injected and cured similar to other elastomeric materials. To minimize the shrinkage, the elastomer is preferably cured at lower temperature (T≦60°) followed by complete cure at higher temperatures (T≧80°).

Among the many commercially available elastomers, such as ECCOSIL and SYLGARD, the use of polydimethylsiloxane based rubbers best satisfy both the material and processing requirements. However, the thermal stability of such elastomers is limited at temperatures below 200° C. and significant outgassing is observed above 100° C. We have found that the thermal stability can be significantly enhanced by the incorporation of 25 wt % or more diphenylsiloxane. Further, enhancement in the thermal stability has been demonstrated by increasing the molecular weight of the resins (oligomers) or minimizing the cross-link junction. The outgassing of the elastomers can be minimized at temperatures below 300° C. by first using a thermally transient catalyst in the resin synthesis and secondly subjecting the resin to a thin film distillation to remove low molecular weight side-products. For our experiments, we have found that 25 wt % diphenylsiloxane is optimal, balancing the desired thermal stability with the increased viscosity associated with diphenylsiloxane incorporation. The optimum number average molecular weight of the resin for maximum thermal stability was found to be between 18,000 and 35,000 g/mol. Higher molecular weights were difficult to cure and too viscous, once filled, to process. Network formation was achieved by a standard hydrosilylation polymerization using a hindered platinum catalyst in a reactive silicon oil carrier.

In FIG. 10 when bond head 124 bonds the wire 126 to the surface 122 of pad 106 there is formed a flattened spherical end shown as 104 in FIG. 6.

The high density test probe provides a means for testing high density and high performance integrated circuits in wafer form or as discrete chips. The probe contacts can be designed for high performance functional testing or high temperature burn-in applications. The probe contacts can also be reworked several times by resurfacing the rigid polymer material that encases the wires exposing the ends of the contacts.

The high density probe contacts described in this disclosure are designed to be used for testing semiconductor devices in either wafer form or as discrete chips. The high density probe uses metal wires that are bonded to a rigid substrate. The wires are imbedded in a rigid polymer that has a cup shaped recess around each to the wire ends. The cup shaped recess 112 shown in FIG. 5 provides a positive self-aligning function for chips with solder ball contacts. A plurality of probe heads 40 can be mounted onto a space transformation substrate 60 so that a plurality of chips can be probed an burned-in simultaneously.

An alternate embodiment of this invention would include straight wires instead of angled wires. Another alternate embodiment could use a suspended alignment mask for aligning the chips to the wire contacts instead of the cup shaped recesses in the top surface of the rigid polymer. The suspended alignment mask is made by ablating holes in a thin sheet of polyimide using an excimer laser and a metal mask with the correct hole pattern. Another alternate embodiment of this design would include a interposer probe assembly that could be made separately from the test substrate as described in U.S. patent application Ser. No. 07/963,364, incorporated by reference herein above. This design could be fabricated by using a copper substrate that would be etched away after the probe assembly is completed and the polymer is cured. This approach could be further modified by using an adhesion de-promoter on the wires to allow them to slide freely (along the axis of the wires) in the polymer material.

Figure 14:
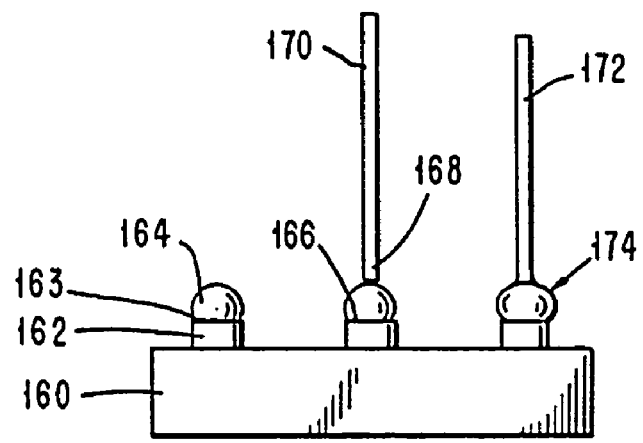
FIG. 14 shows the elongated conductors of the probe tip fixed by solder protuberances to contact locations on a space transformation substrate.

FIG. 14 shows an alternate embodiment of probe tip 40 of FIGS. 2 and 3. As described herein above, probe tip 40 is fabricated to be originally fixed to the surface of a first level space transformer 54. Each wire 120 is wire bonded directly to a pad 106 on substrate 60 so that the probe assembly 40 is rigidly fixed to the substrate 60. The embodiment of FIG. 14, the probe head assembly 40 can be fabricated via a discrete stand alone element. This can be fabricated following the process of U.S. patent application Ser. No. 07/963,348, filed Oct. 19, 1992, which has been incorporated herein by reference above. Following this fabrication process as described herein above, wires 42 of FIG. 14 are wire bonded to a surface. Rather than being wire bonded directly to a pad on a space transformation substrate, wire 42 is wire bonded to a sacrificial substrate as described in the application incorporated herein. The sacrificial substrate is removed to leave the structure of FIG. 14. At ends 102 of wires 44 there is a flattened ball 104 caused by the wire bond operation. In a preferred embodiment the sacrificial substrate to which the wires are bonded have an array of pits which result in a protrusion 150 which can have any predetermined shape such as a hemisphere or a pyramid. Protrusion 150 provides a raised contact for providing good electrical connection to a contact location against which it is pressed. The clamp assembly 80 of FIGS. 2 and 3 can be modified so that probe tip assembly 40 can be pressed towards surface 58 of substrate 60 so that ends 104 of FIG. 14 can be pressed against contact locations such as 106 of FIG. 5 on substrate 60. Protuberances 104 are aligned to pads 100 on surface 58 of FIG. 5 in a manner similar to how the conductor ends 86 and 88 of the connector in FIG. 4 are aligned to pads 75 and 64 respectively.

Figure 15:
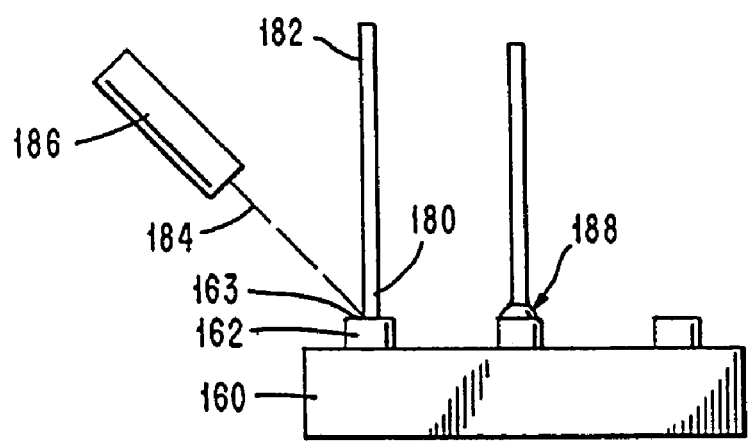
FIG. 15 shows the elongated conductors of the probe tip fixed by laser weld protuberances to contact locations on a space transformation substrate.

As shown in the process of FIGS. 7 to 9, wire 126 is ball bonded to pad 106 on substrate 60. An alternative process is to start with a substrate 160 as shown in FIG. 15 having contact locations 162 having an electrically conductive material 164 disposed on surface 166 of contact location 162. Electrically conductive material 164 can be solder. A bond lead such as 124 of FIG. 7 can be used to dispose end 168 of wire 170 against solder mound 164 which can be heated to melting. End 168 of wire 170 is pressed into the molten solder mound to form wire 172 embedded into a solidified solder mound 174. Using this process a structure similar to that of FIG. 5 can be fabricated.

Figure 16:
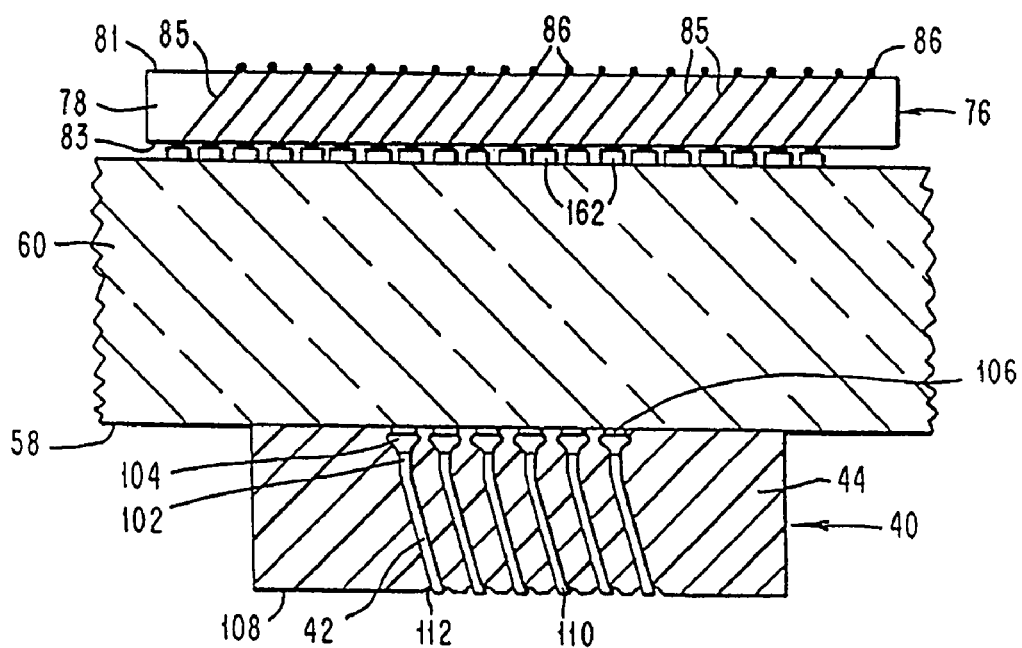
FIG. 16 shows both interposer 76 and probe tip 40 rigidly bonded to space transformer 60.

FIG. 16 shows another alternative embodiment of a method to fabricate the structure of FIG. 5.

Numerals common between FIGS. 15 and 16 represent the same thing. End 180 elongated electrical conductor 182 is held against top surface 163 of pad 162 on substrate 160. A beam of light 184 from laser 186 is directed at end 180 of elongated conductor 182 at the location of contact with surface 163 of pad 162. The end 180 is laser welded to surface 163 to form protuberance 186.

In summary, the present invention is directed to high density test probe for testing high density and high performance integrated circuits in wafer form or as discrete chips. The probe contacts are designed for high performance functional testing and for high temperature burn in applications. The probe is formed from an elastomeric probe tip having a highly dense array of elongated electrical conductors embedded in an elastomeric material which is in electrical contact with a space transformer.

U.S. Pat. No. 5,371,654, entitled "THREE DIMENSIONAL HIGH PERFORMANCE INTERCONNECTION PACKAGE", incorporated by reference above, copied in its entirety here, is directed to a structure for packaging electronic devices, such as semiconductor chips, in a three dimensional structure which permits electrical signals to propagate both horizontally and vertically. The structure is formed from a plurality of assemblies. Each assembly is formed from a substrate having disposed on at least one surface a plurality of electronic devices. Each assembly is disposed in a stack of adjacent assemblies. Between adjacent assemblies there is an electrical interconnection electrically interconnecting each assembly. The electrical interconnection formed from an elastomeric interposer having a plurality of apertures extending therethrough. The array of apertures corresponds to the array of electronic devices on the substrates. The aperture and electrical interconnection is disposed over the array of electronic devices so that the electrical interconnection between adjacent electronic devices. The stack of assemblies is compressed thereby compressing the electrical interconnection between adjacent assemblies. Methods for fabricating the electrical interconnection as a stand alone elastomeric sheet are described.

The U.S. Pat. No. 5,371,654 invention is directed to packaging structures for interconnecting electronic devices in a three dimensional structure. More particularly, the present invention is directed to a structure having a plurality of substrates wherein each substrate has a plurality of electronic devices thereon forming an assembly. There are a plurality of assemblies disposed one on top of each other with a vertical wiring interconnection structure disposed between adjacent assemblies. Most particularly, the vertical wire interconnection structure contains a plurality of electrical conductors disposed in an elastomeric material and is compressed between adjacent assemblies.

In the microelectronics industry, integrated circuits, such as semiconductor chips, are mounted onto packaging substrates to form modules. In high performance computer applications, these modules contain a plurality of integrated circuits. A plurality of modules are mounted onto a second level of packages such as a printed circuit board or card. The cards are inserted in a frame to form a computer.

In nearly all conventional interconnection packages except for double sided cards, signals from one chip on the package travel in a two dimensional wiring net to the edge of the package then travel across a card or a board or even travel along cables before they reach the next package containing the destination integrated circuit chip. Therefore, signals must travel off of one module onto wiring on a board or onto wiring on a cable to a second module and from the second module to the destination integrated circuit chip in the module. This results in long package time delays and increases the wireability requirement of the two dimensional wiring arrays.

An improvement in interchip propagation time and increase in real chip packaging density can be achieved if three dimensional wiring between closely spaced planes of chips could be achieved.

U.S. patent application Ser. No. 5,099,309 describes a three dimensional semiconductor chip packaging structure which comprises a plurality of stacked cards. Each card is specially fabricated to have cavities on both sides thereof which contain chips. On each surface of the card, there are electrical conductors which are bonded by wires to contact locations on the chips. Electrical conductors extend through the cards between the chip containing regions and to contact locations on each side of the card. These contact locations have dendrites on the surface. The cards are stacked so that the dendrite covered contact locations on adjacent sides of adjacent cards intermesh to provide electrical interconnection between the adjacent cards. This structure requires a high degree board flatness for the connections to be mated.

It is an object of the incorporated U.S. Pat. No. 5,371,654 invention to provide improved three dimensional integrated circuit packaging structures.

Another object of the incorporated U.S. Pat. No. 5,371,654 is to provide such a packaging structures with both horizontal electrical interconnections and compliant vertical electrical interconnections.

A further object of the incorporated U.S. Pat. No. 5,371,654 to provide such structures which can be assembled and disassembled into a plurality of subassemblies.

An additional object of the incorporated U.S. Pat. No. 5,371,654 is to provide such structures which have a high thermal dissipation capacity.

Yet another object of the incorporated U.S. Pat. No. 5,371,654 is to provide such structures which does not require rigid electrical interconnection between subassemblies.

Yet a further object of the incorporated U.S. Pat. No. 5,371,654 invention is to provide such structures which can be fabricated using conventional packaging substrates.

A broad aspect of the incorporated U.S. Pat. No. 5,371,654 invention is a structure having a plurality of assemblies. Each of the assemblies is formed from a substrate having a first and second opposing surfaces. There are a plurality of electronic devices disposed on at least one of the first and second surface of the substrate of each assembly. Each of the plurality of assemblies is disposed adjacent another of the plurality of assemblies so that the first surface of one of the adjacent assemblies is adjacent the second surface of the other of the adjacent assemblies. An electrical interconnection means is disposed between the first and second surfaces of the adjacent assemblies and provides electrical interconnection between contact locations on the adjacent surfaces. The electrical interconnection means is formed from a dielectric material having first and second opposing surfaces and a plurality of electrical contact locations on each surface which are electrically interconnected by a plurality of electrical conductors extending from the first surface to the second surface of the electrical interconnection means.

In a more particular aspect of the incorporated U.S. Pat. No. 5,371,654, the substrates of the assemblies are formed from a diamond like material which has high thermal dissipation capacity.

In another more particular aspect of the incorporated U.S. Pat. No. 5,371,654, the substrates have a plurality of dielectric and electrically conducting layers.

In another more particular aspect of the incorporated U.S. Pat. No. 5,371,654, a heat dissipation means dissipates heat generated in the structure.

Figure 17:
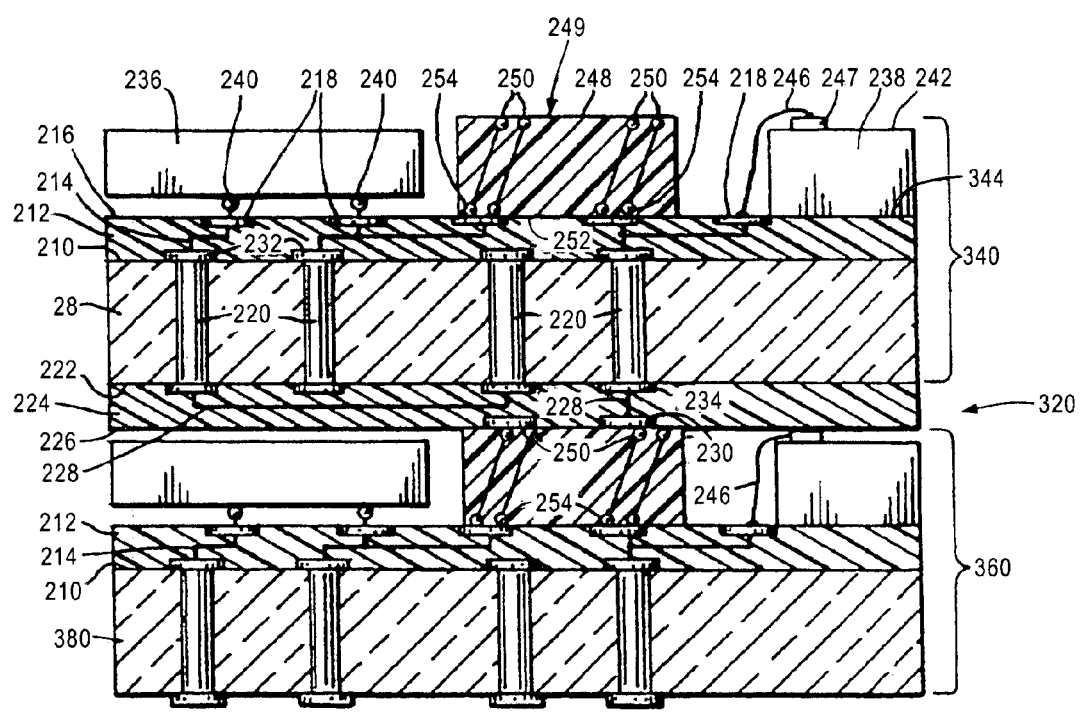
FIG. 17 shows a side view of a three dimensional electronic device packaging structure according to the present invention.

FIG. 17 shows structure 322 according to the present invention having two subcomponent assemblies 340 and 360. Structure 320 can have any number of subcomponent assemblies. Each subcomponent assembly is formed from a substrate 380 having a surface 210 which has a multilevel wiring structure 212 formed thereon. Multilevel wiring structure 212 is formed from a dielectric material, such as an oxide, a glass, a polymer and a ceramic, most preferably a polyimide polymer. Multilevel wiring structure 212 contains at least one layer of electrical conductors 214, such as copper, aluminum and gold, and has on surface 216 a plurality of contact locations 218. Substrate 380 is shown in FIG. 17 as having vias 220 extending from surface 210 to surface 222. Surface 222 has a multilayer wiring structure 224 which is similar to multilayer wiring structure 212. Surface 226 of multilayer wiring structure 224 contains at least one electrically conductive layer 228 which is preferably copper, the dielectric material being preferably polyimide. Surface 226 has a plurality of electrical contact locations 230 which are preferably copper coated with gold. Electrical contact layers 218 are also preferably copper with a top coating of gold.

Substrate 380 can be any commonly used multilayered packaging substrate containing a plurality of electrical conductors or glass ceramic and is preferably a highly thermally conductive material such as synthetic diamond, aluminum nitride ceramic, silicon, a metal (such as copper) with an electrically insulating coating. Substrate 380 preferably has electrically conductive studs or vias 220 or through holes with a sidewall plated with an electrical conductor, such as copper, palladium, platinum and gold, as is commonly known in the art.

The electrical conductors in multilayer structures 212 on surface 210 of substrate 380 are electrically interconnected to contact locations 232 which are connected to via or stud 220 in substrate 380. Electrical conductors 228 in multilayer structure 224 on surface 222 of substrate 380 are electrically interconnected to contact locations 234 which are electrically interconnected to vias or studs 220 in substrate 380. Contact locations 232 and 234 are preferably formed from copper having a top surface of gold.

A plurality of electronic devices 236 and 238, such as integrated circuit chips, preferably semiconductor chips, are mounted onto surface 216 of multilayer wiring structure 212.

Electronic device 236 is mounted in a flip-chip-configuration onto surface 216 with solder mounds 240, commonly known as C4s, electrically interconnecting the electronic device 236 to the contact locations 218.

Electronic device 238 is mounted with active face 242 facing upwards and its nonactive face 244 in contact with surface 216 of multilayer structure 212. Alternatively, for better thermal contact to substrate 380, device 238 may be mounted directly with its nonactive face 244 in contact with surface 210 of substrate 380. This is accomplished by removing a section of multilayer structure 212. Wires 246 commonly made of aluminum or gold are bonded between contact location 218 and contact location 247 on surface 242 of electronic device 238. Wires 246 are bonded by commonly known wire bonding techniques, ultrasonic bonding techniques, laser bonding techniques and the like.

Disposed between electronic devices 236 and 238 there is an electrical interconnection means 249 details of which will be described hereinbelow.

The electrical interconnection means 249 has a top surface 248 having contact locations 250 and a bottom surface 252 having contact locations 254. Contact locations 254 are in electrical interconnection with contact locations 218 between chips 236 and 238. Contact locations 250 are in electrical interconnection with contact locations 230 on surface 226 of multilayer structure 224.

Figure 18:
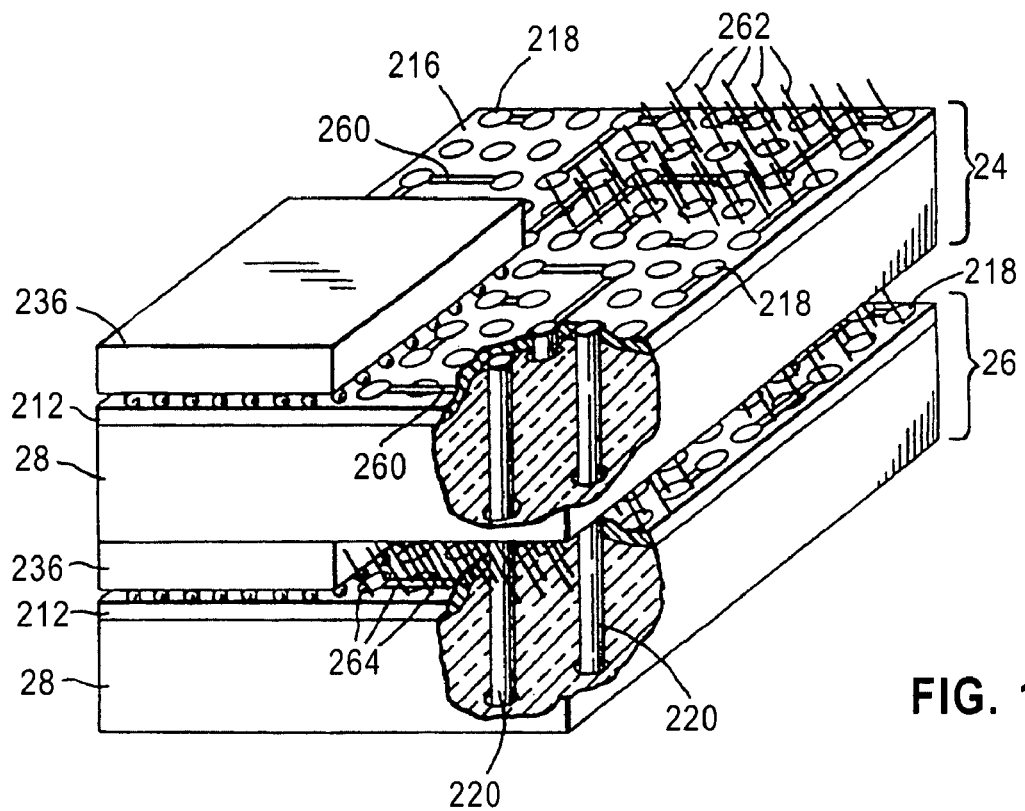
FIG. 18 shows a partial perspective view of the structure of FIG. 17.

FIG. 18 shows a partial view of the structure of FIG. 17 in perspective with a region of the right forward most corner of each substrate 380 partially cut away to reveal vias or studs 220. On surface 216, there is seen contact locations 218 and electrical conductors 260 which electrically interconnect some of the contact locations 218. The electrical interconnection means 249 is shown only partially as a plurality of electrical conductors 262 and 264. The electrical interconnection means will be described in greater detail hereinbelow.

Figure 19:
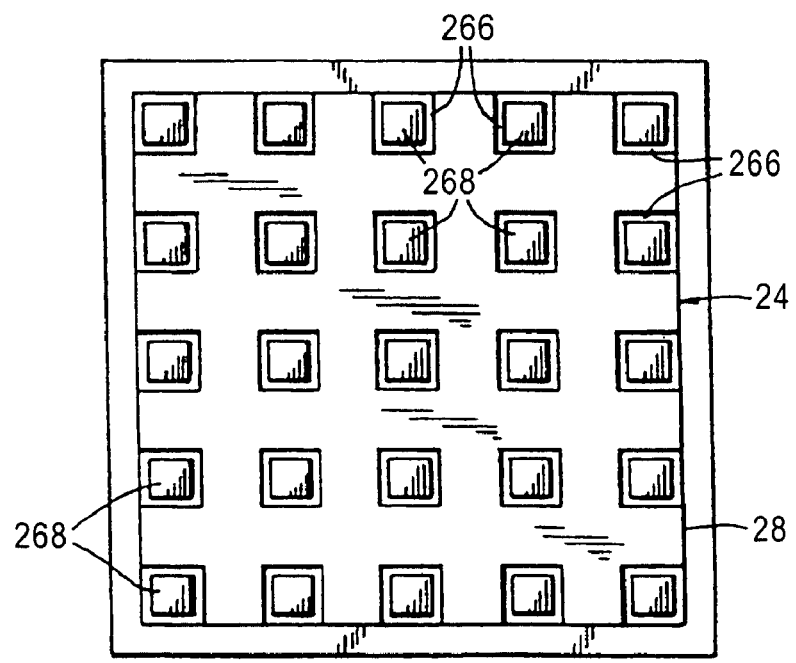
FIG. 19 shows a top view of the electrical interconnection means of the structure of FIG. 17.

FIG. 19 shows a top view of one of the subcomponent assemblies 340 or 360 of FIG. 17 showing the electrical interconnection means 249 having a plurality of apertures 266. The apertures 266 are adapted to receive a plurality of electronic devices 268 which are disposed on surface 216 of multilevel wiring structure 212 of FIG. 17. Numbers common between FIGS. 17, 18 and 19 represent the same thing.

Figure 20:
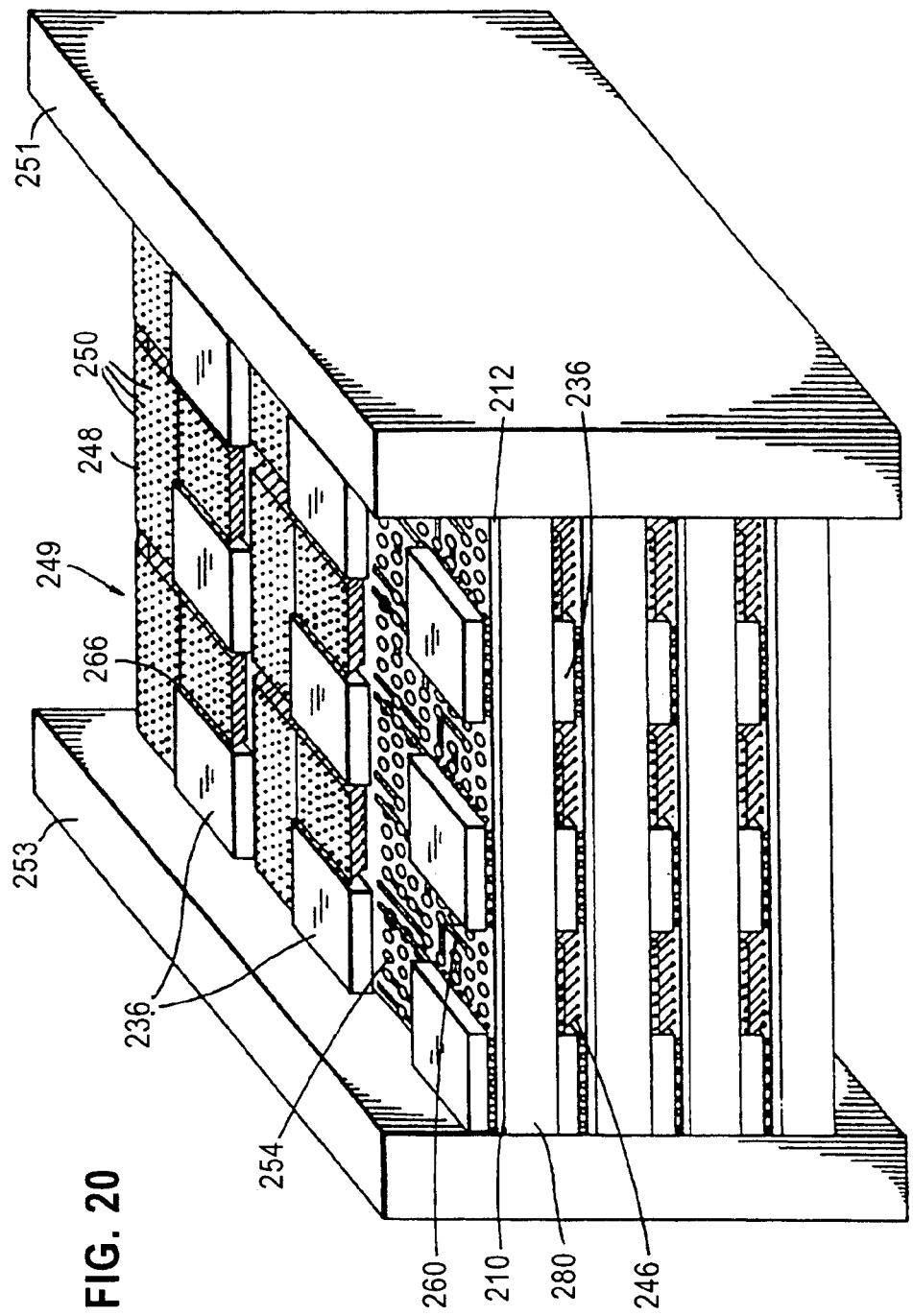
FIG. 20 shows a perspective view of the structures of FIG. 17 including a heat dissipation means.

FIG. 20 shows a perspective view of the structure shown in FIG. 17 plus heat dissipation means 251 and 253. Numbers common between FIGS. 17, 18, 19 and 20 represent the same thing. Heat dissipation means 251 and 253 are in thermal contact with substrates 380. The heat dissipation means is preferably made of aluminum. Substrate 380 is held in grooves in heat dissipation means 251 and 253 to ensure good thermal contact, mechanical support and compresses the interconnection means 249 between adjacent assemblies to provide electrical interconnection therebetween as described herein below. Heat dissipation means 251 and 253 are held in a support frame (not shown).

The thin film wiring layers 212 and 214 of FIG. 17 preferably contain at least one plain pair (XY) of wiring and two reference planes which provide power and ground to the electronic devices 236 and 238. If the electronic devices are bipolar chips there are preferably two additional power planes. The dimensions of the wiring and the thickness of the reference planes depends on the specific application and it can vary from 380 micron wide lines, 5 micron thick, on a 25 micron pitch to 25 micron wide lines, 25 microns thick on a pitch of 75 micron or more. The thickness of the insulation in the thin film wiring layers 212 and 224 is adjusted to provide the required transmission line impedance that is typically in the range of 4 to 80 ohms.

The electrical interconnection means 249 is formed to occupy the space between the chips as shown in FIGS. 17-20. The structure of FIG. 17 is compressed from the top and bottom of the structure to compress the electrical interconnection means 246 between the adjacent assemblies pressing electrical contact locations 230 on substrate 380 in contact with electrical contact locations 250 on electrical interconnection means 249 and pressing electrical contact locations 254 on electrical interconnection means 249 in contact with electrical contact locations 218 on the surface of the thin film wiring layer 212. Thus, a signal from any one chip will travel in the thin film wiring layer and vertically through the electrical interconnection wiring means 249 to any thin film wiring plane in the stack of substrates 380 and thus along the shortest path to any chip in the entire structure 2. If a single plane contained 25 chips, for example, as shown in FIG. 19, each being 1 centimeter square, then the electrical interconnection means 246 would occupy the 1 centimeter space between each chip. With this design point the vias in the substrates 380 and the connections in the electrical interconnection means 249 could be made on a 36 mil square grid with 20 mil wide pads 218 on the substrate 380. There would be approximately 6,694 vertical signal connections possible on one plane. The grid could be reduced by a factor of approximately 2 if required and 26,000 vertical connections could be made.

The overall high performance package can consist of as many insulating plates populated by chips as required. The heat would be conducted to the edges of the high thermal conductivity substrates 380 where it would carried away by air or water cooled or the like heat sinks as appropriate and commonly known in the art.

The substrates are preferably made of a high thermally conductive insulating material made of commercial diamond (manufactured for example by NORTON Inc. and Diamonex Inc.) which can be laser drilled to form vias and metallized for through hole connections using standard processing such as the process used on diamond heat spreaders for diode lasers. The very high thermal conductivity of diamond (1500 W/m° K.) makes it the most desirable material in this structure and would allow the cooling of more than 100 watts per plane. Other materials are useful. A lower cost alternative would be AnN ceramic with co-sintered solid vias, which are commercially available or silicon wafers which can contain laser drilled holes or chemically etched through vias. The thin film wiring layer 212 and 224 preferably contains copper wiring in a polyimide dielectric and can be fabricated by standard sequential thin film processes directly onto substrate 380 as described in R. Tummala and E. Rymasizewski, Microelectric Packaging Handbook, Van Nostrand, Rienhold, N.Y., 1989 Chapter 9, the teaching of which is incorporated herein by reference. The thin film wiring structure can be fabricated separately by the serial/parallel thin film wiring process and joined to the substrates 380 as described in U.S. patent application Ser. No. 07/695,368, filed May 3, 1991, the teaching of which is incorporated herein by reference. In the serial/parallel processes the thin film wiring structures are fabricated on separate carriers then transferred and laminated to the insulated plates preferably by thermal compression bonding. The electrical interconnection means 249 preferably contains gold wires held at a slight angle in an elastomeric matrix. Other embodiments of large area array connectors can also work. The electrical interconnection means 249 using an elastomeric matrix has desirable properties such as lower resistance, low contact force, wipe, and low inductance which makes it particularly desirable in this application. The electrical interconnection means 249 can be fabricated to be approximately 1 millimeter thick with 10 percent compliance.

The substrates 380 are made with conducing vias. Top and bottom surface pads are applied by standard techniques such as evaporation of metals through a metal mask as described in Tiemmala et al., chapter 9 above. The electronic devices 36 and 38 are joined to each thin film wiring layer after the electronic devices are tested and burned in. The electrical interconnection means 249 are fabricated separately and tested. Finally, the stack of assemblies with electronic devices mounted onto the substrates with the electrical interconnection means 249 disposed thereon are aligned and a compressive force is applied to make the interconnections. The force is preferably from 10 to 50 grams per contact or from 70 to 300 kilograms for the entire package. The connection is separable.

Figure 32:
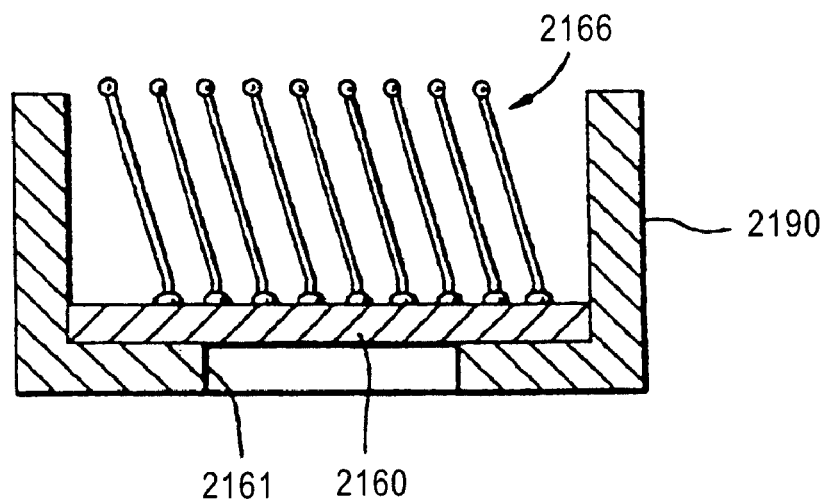
Figure 33:
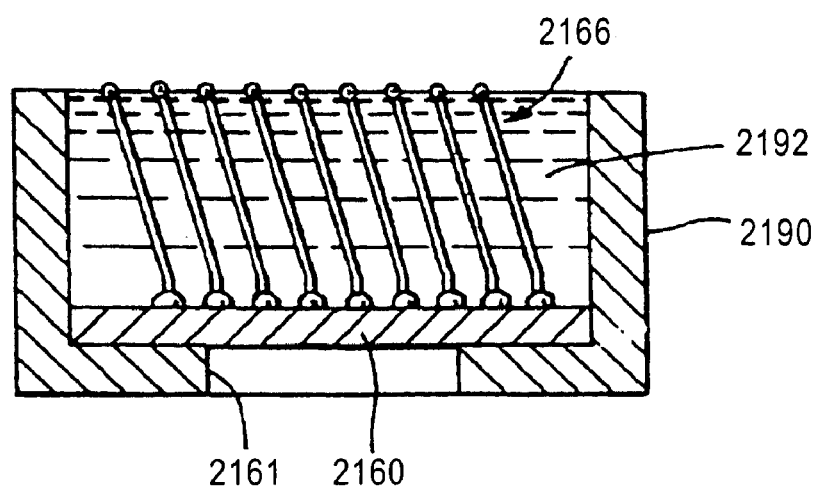

FIGS. 21-37 show the method for fabricating electrical interconnection means 249 of FIG. 33 and show various embodiments and fabrication techniques of this electrical interconnection means.

Figure 21:
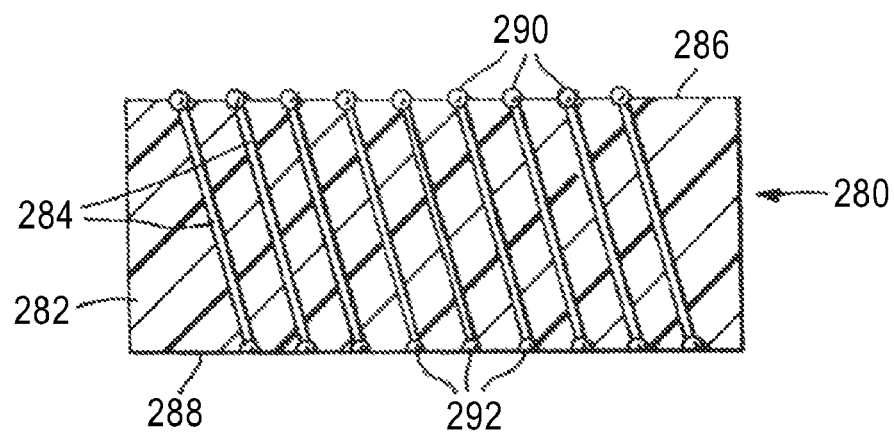
FIG. 21 shows a cross sectional view of a section of the electrical interconnection means of the structure of FIG. 17.

FIG. 21 shows electrical interconnection means 280 which corresponds to electrical interconnection means 249 of FIG. 33. The electrical interconnection means 280 is formed from an elastomeric material 282 having a plurality of electrical conductors 284 extending from side 286 to side 288 thereof. Each conductor 284 preferably has a generally spherical end 290 at side 286 and a flattened spherical shape 292 at side 288. The conductors 284 are preferably gold, gold alloy or copper alloy. The size, shape and the spacing of wires 284 along with the material properties of the elastomeric material 282 can be modified to optimize the connector for a specific application.

Figure 22:
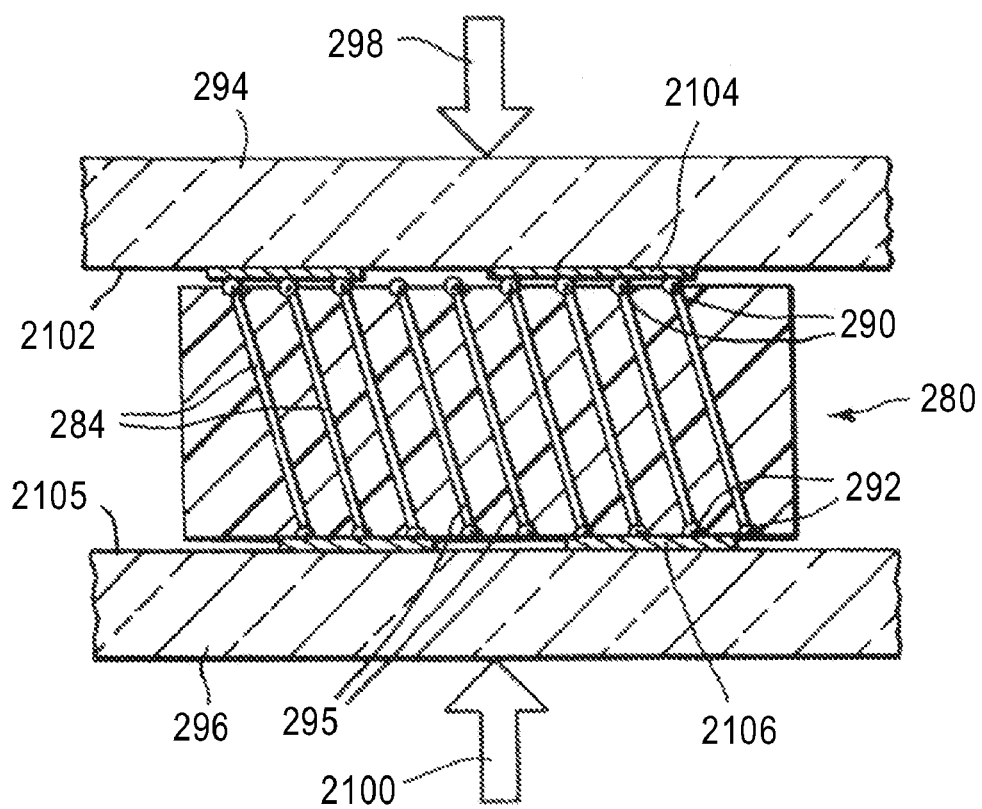
FIG. 22 shows the structure of FIG. 21 disposed under pressure between two adjacent substrates.

FIG. 22 shows substrate 294 and 296 pressed towards each other as indicated by arrows 298 and 2100 with interposer 280 therebetween. The elastomer 282 acts as a spring to push the enlarged end contact surfaces 290 and 292 against mating contacts 2104 and 2106 on substrates 294 and 296 respectively. Surface 2102 of substrate 294 has contact locations 2104 which are typically metallized pads. Substrate 296 has contact locations 2106 which are also typically metallized pads. When substrate 294 is pressed towards substrate 296 the ends 290 and 292 move laterally with respect to the contact surface because conductors 284 are at a nonorthogonal angle with respect thereto. This lateral movement results in a wiping action which breaks a surface oxide which is on the surface of the contact locations 2104 and 2106 and which is on the surface of the enlarged ends 290 and 292. The wiping action makes a good electrical contact between the enlarged surface 290 and 292 and the contact locations 2104 and 2106, respectively.

The advantages and unique features of the electrical interconnection means 280 are that it provides uniform spacing of the electrical conductors 284 and the elastomer material on, for example, a 0.008 inch minimum pitch using a single wire per contact. The enlarged ball shaped contacts 290 protrude from top side 286 of interconnection means 280 and the enlarged, flattened contacts 292 are generally flush with the bottom surface 288 of interconnection means 280. Textured or raised contact surface can be formed on the bottom side of the contact 292 to enhance the contact interface to an electrical contact location on substrate 296. The wires 284 in the elastomer material 282 can be grouped into small clusters to provide redundant connections for each contact location 2104 or 2106. If clustered wires are used, wires 295 in interconnect structure 280 of FIG. 22 would be eliminated.

Figure 23:
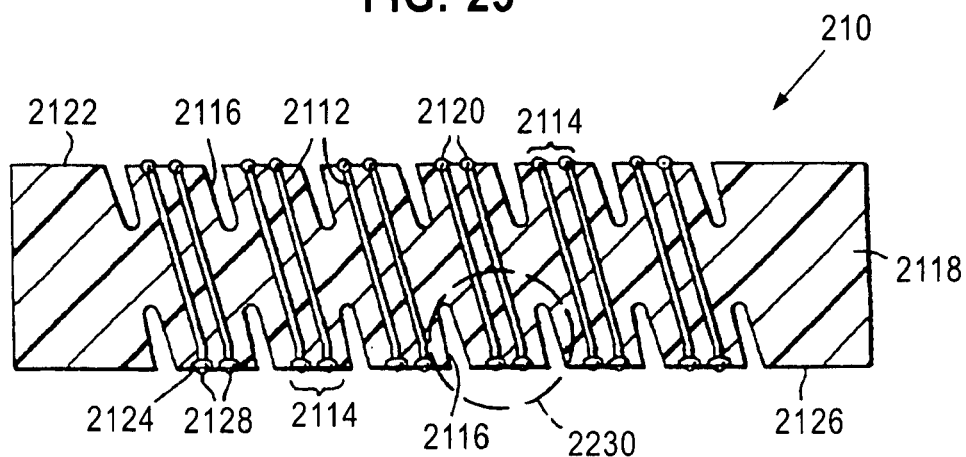
FIG. 23 shows another embodiment of the structure of FIG. 21 having grooves on the two opposing surfaces.

FIG. 23 shows a cross section of another embodiment 2110 corresponding to the electrical interconnection means 249 of FIG. 17. Structure 2110 has electrical conductors 2112 which are clustered into groups 2114. Between each group there are grooves 2116. The elastomer material 2118 is preferably a silicone elastomer and there are ball shaped contacts 2120 on side 2122 and flat contact 2124 on side 2126 having a raised surface 2128. The top and bottom wire shapes can be varied for optimization. The alignment grooves 2116 of structure 2110 can be formed using a laser, electron beam or other sensing techniques as described in U.S. Pat. No. 4,998,885, to Beaman, the teaching of which is incorporated herein by reference.

Alignment features 2116 can be molded into the elastomer material to allow accurate alignment of the conductors 2112 in the structure 2110 with contact locations 2104 and 2106 on surfaces 2102 and 2105, respectively, as shown in FIG. 22. An alignment mechanism is preferred to enhance accurate positioning of the interposer wires with the contacts on the adjacent substrates. The molded alignment features can also be used to control the shrinkage and distortion of the contact grid in the elastomer material. Mechanically or thermally induced stress in the elastomer material can cause the interposer or distort causing alignment problems with the mating contacts.

Figure 24:
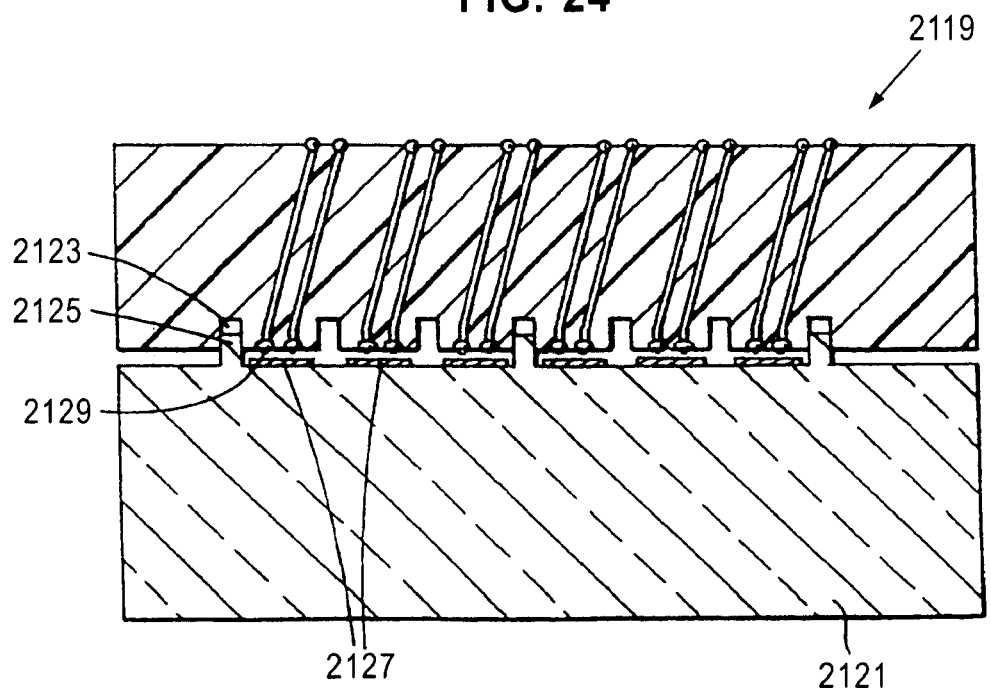
FIG. 24 shows grooves on an interposer engaging projections on a substrate to align substrate and interposer contact locations.
Figure 26:
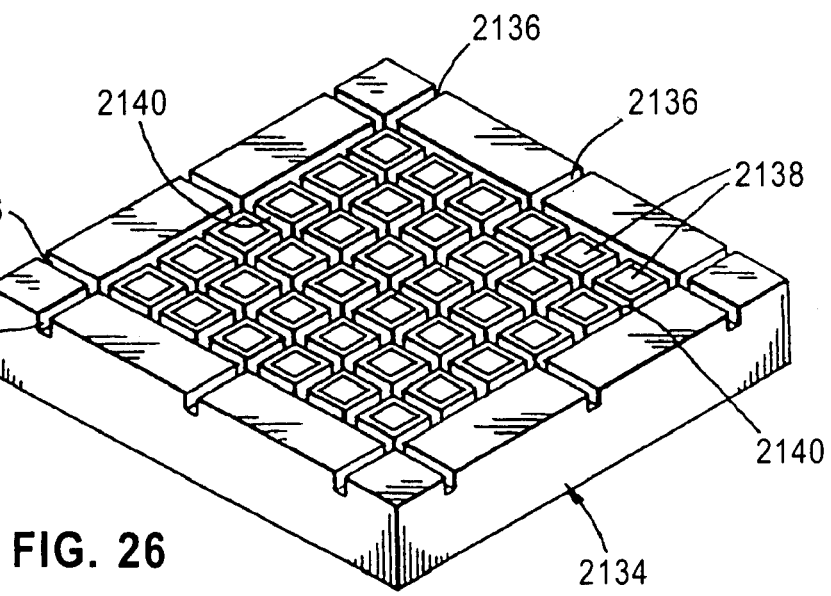
FIG. 26 shows an interconnection structure having grooves for mating with the frame of FIG. 25.

The electrical interconnection means shown in FIGS. 21, 23 and 24 and electrical interconnection means 249 of FIG. 17 will also be referred to herein as an ELASTICON interposer. The ELASTICON interposer is designed to provide signal and power connections from the bottom surface of a substrate to another substrate. The ELASTICON interposer can be fabricated to have a full array of conductors or a clustered array of conductors. The interposer connector that uses a full array of conductors (or wires) would typically not require alignment of the connector to the contact locations on the substrate between which is disposed. By using clusters of wires, overall fewer wires are used to fabricate the interposer. This is useful for reducing the cost of the connector and the pressure required to ensure full engagement of the contacts. Interposer contacts that use a clustered array of wires preferably have a means for aligning the wire clusters with the remaining said contacts. An interposer having a cluster set of wires minimizes the number of wires required during the interposer fabrication and enhances the compliance of the connector assembly. The molded or scribed grooves or other features in the elastomer material can be used to allow the interposer connector to self align with similar features on the substrates between which is disposed as shown in FIG. 24. FIG. 24 shows interposer 2119 disposed on substrate 2121. Interposer 2119 has grooves 2123 which mate with projections 2125 on substrate 2121 which aligns substrate pads 2127 to interposer contact locations 2129. These alignment features can be designed using a variety of simple geometric shapes such as circular post, rectangular ridges, or a raised grid pattern. FIG. 26 shows a perspective view of an ELASTICON interposer useful as the electrical interconnection means 249 of FIG. 17. The ELASTICON interposer 2134 of FIG. 26 has a plurality of alignment grooves 2136 and regions 2138 containing clustered contacts wherein each region is surrounded by grooves 2140.

Figure 25:
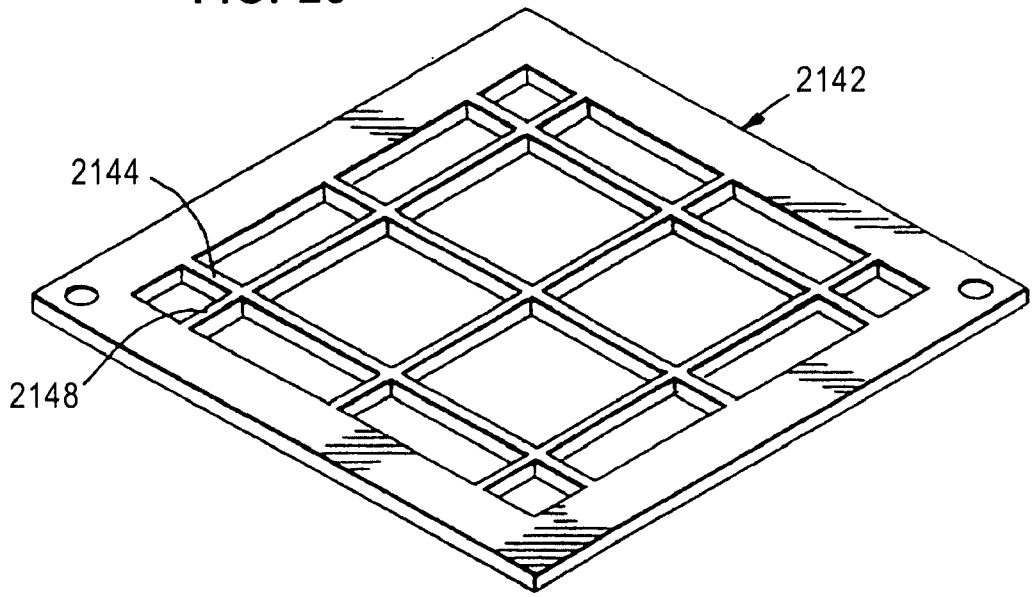
FIG. 25 shows an alignment frame for mating with alignment grooves such as shown in the structure of FIG. 26.

FIG. 25 shows an alignment frame 2142 which is adapted for engagement with the grooves on the interposer 2134 of FIG. 26 to align substrate contact locations to interposer contact locations. For example, bar 2144 in alignment frame 2142 engages groove 2146 of structure 2134 of FIG. 26 and bar 2148 of frame 2142 engages groove 2150 of structure 2134 of FIG. 26. The frame is disposed on a substrate having contact locations to which interposer contact locations are to be aligned.

An overall alignment scheme is preferred to fabricate the structure of FIG. 17. Each of the disconnectable elements of the module preferably have a means of alignment to the other elements in the module. A separate alignment frame could be attached to each substrate similar to the one used for the interposer.

FIGS. 27-35 show a fabrication method for the ELASTICON interposers described herein.

Figure 27:
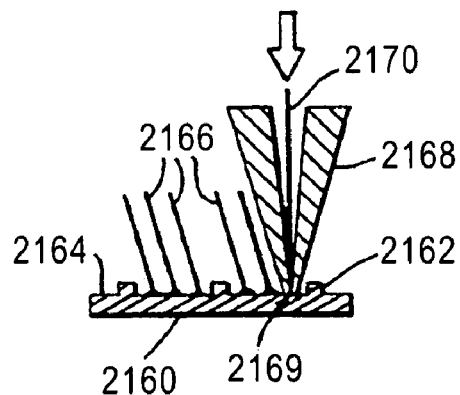
FIGS. 27-35 show the process for making the electrical interconnection means, for example, of FIG. 21.

The fabrication process starts with a sacrificial substrate 2160, which is preferably copper, copper/Invar/copper or copper/molybdenium copper. Materials other than copper can be used such as aluminum, hard plastic or steel. The substrate 2160 can be fabricated to have protuberances 2162 which provide the grooves 2116 in the ELASTICON interposers of FIG. 23. The protuberances 2162 can be formed using various fabrication techniques including machining of the surface 2164 or stamping of the surface 2164. After the substrate has been formed with the protuberances, the top surface 2164 is sputtered or plated with soft gold or Ni/Au to provide a suitable surface for thermosonic ball bonding. Other bonding techniques can be used such as thermal compression bonding, ultrasonic bonding, laser bonding and the like. A commonly used automatic wire bonder is modified to ball bond gold, gold alloy, copper, copper alloy, aluminum, nickel or palladium wires 2166 to the substrate surface 2164 as shown in FIG. 27. The wire preferably has a diameter of 0.001 to 0.005 inches. If a metal other than Au is used, a thin passivation metal such as Au, Cr, Co, Ni or Pd can be coated over the wire by means of electroplating, or electroless plating, sputtering, e-beam evaporation or any other coating techniques known in the industry. Structure 2168 of FIG. 27 is the ball bonding head which has a wire 2170 being fed from a reservoir of wire as in a conventional wire bonding apparatus. FIG. 27 shows the ball bond head 2168 in contact at location 2169 with surface 2164 of substrate 2160.

Figure 28:
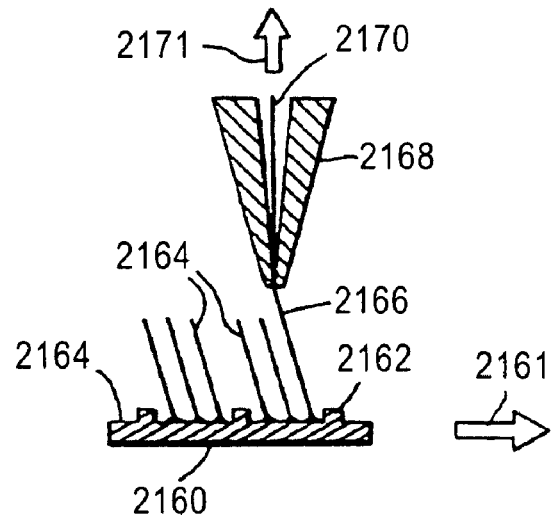
Figure 29:
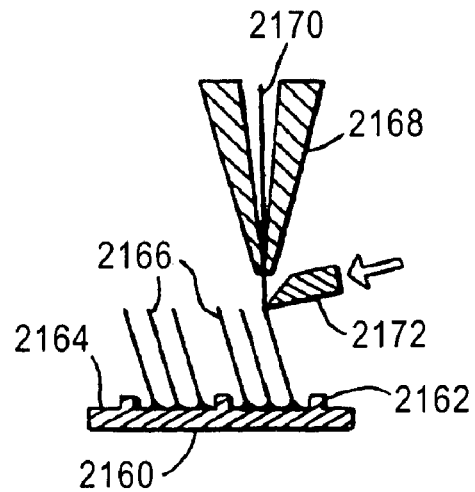

FIG. 28 shows the ball bonding head 2168 withdrawn in the direction indicated by arrow 2171 from the surface 2164 and the wire 2170 drawn out to leave disposed on the surface 2164 wire 2166. In the preferred embodiment, the bond head 2168 is stationary and the substrate 2160 is advanced as indicated by arrow 2161. The bond wire is positioned at an angle preferably between 5° and 60° from vertical and then mechanically severed by knife edge 2172 as shown in FIG. 29. The knife edge 2172 is actuated, the wire 2170 is clamped and the bond head 2168 is raised. When the wire 2170 is severed there is left on the surface 2164 of substrate 2160 a flying lead 2166 which is bonded to surface 2164 at one end and the other end projects outwardly away from the surface. A ball can be formed on the end of the wire 2166 which is not bonded to surface 2164 using a laser or electrical discharge to melt the end of the wire.

Techniques for this are commonly known in the art. A split beam laser delivery systems, described hereinbelow, is used to localize the laser energy to a single wire for forming the ball. This minimizes the laser energy absorbed by adjacent wires that could cause the wires to deform. A ball is not required on the end of the wire. This modified wire bonding process is repeated to form a dense array of angled wires on the substrate.

Figure 30:
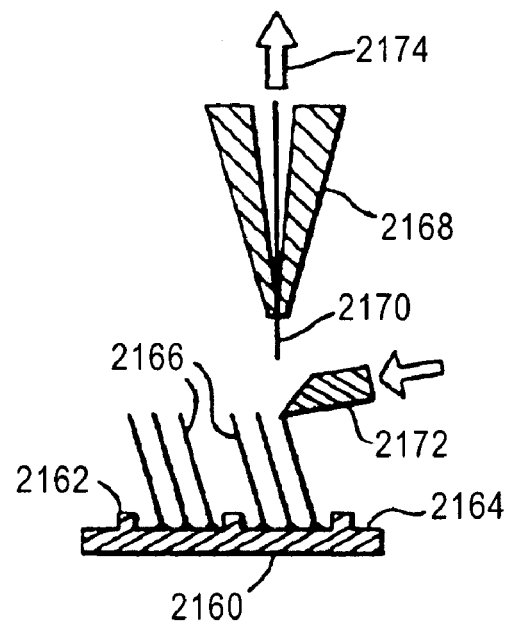

FIG. 30 shows the wire 2170 severed to leave wire 2166 disposed on surface 2164 of substrate 2160. The wire bond head 2168 is retracted upwardly as indicated by arrow 2174.

The wire bond head 2168 has a mechanism to grip and release wire 2170 so that wire 2170 can be tensioned against the shear blade to sever the wire.

Figure 31:
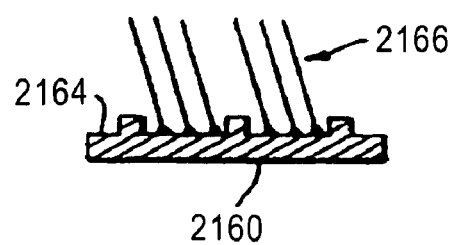

FIG. 31 shows that the wire is severed, the bond head is raised to a "home" position. An electronic flame off unit (part of Hughes Wire Bonder, Modec III-2640) electrode is positioned below the bond head and an electrical discharge from the electrode is used to melt the wire in the capillary tip to form a ball.

Figure 34:
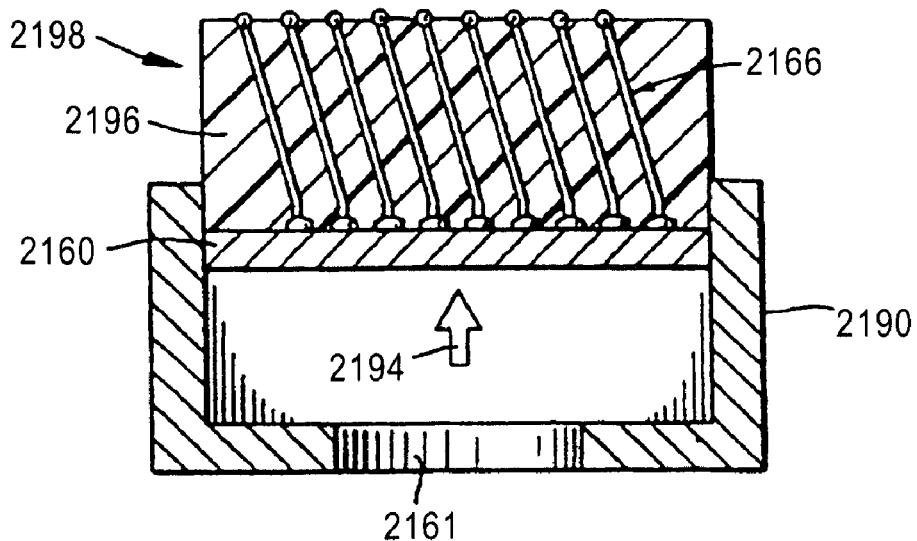
Figure 35:
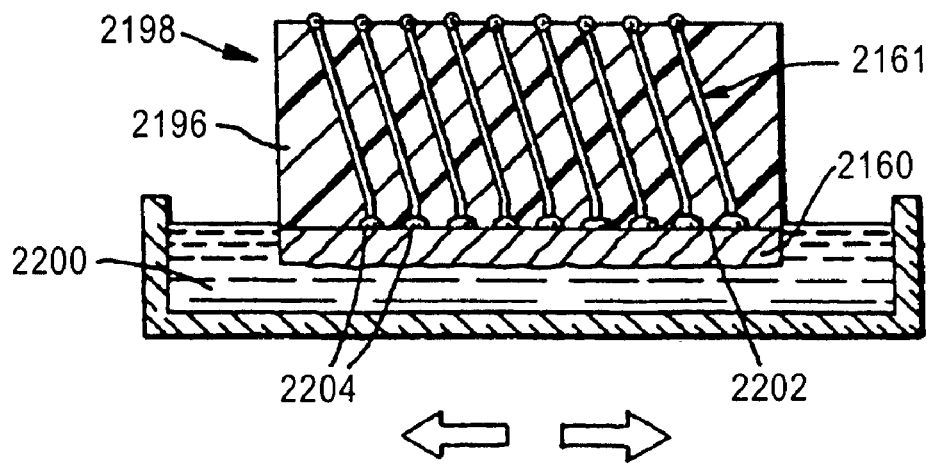

After the wire bonding process is completed, the substrate 2160 is placed in a casting mold 2190 as shown in FIG. 32. A controlled volume of liquid elastomer 2192 is disposed into the casting mold and allowed to settle out (flow between the wires until the surface is level) before curing as shown in FIG. 33. Once the elastomer has cured, the substrate is extracted from the mold as shown in FIG. 34 and indicated by arrow 2194. The cured elastomer is represented by reference rule 2196. Opening 2161 in mold 2190 is a tooling feature for extracting the substrate from the mold. The structure 2198 is removed from the mold 2190 and is placed in a sulfuric and nitric acid bath 2200, as shown in FIG. 35 to dissolve the copper substrate 2160. Ultrasonic agitation of the sulfuric and nitric acid helps to facilitate the etching of the copper substrate and causes the gold plating on the surface of the copper substrate to flake off from the surface 2202 of the elastomer material 2196 leaving the surface of the ball bonds 2204 exposed.

Alternatively, the substrate can be made of peel-apart-copper, where a thin layer of copper is attached to a solid substrate with a marginal adhesion strength. After the fabrication is completed, the connector can be peeled off from the sacrificial substrate before the remaining thin copper is flash etched away.

A high compliance, high thermal stability siloxane elastomer material is preferable for this application. The high temperature siloxane material is cast or injected and cured similar to other elastomeric materials. To minimize the shrinkage, the elastomer is preferably cured at lower temperature (T<60°) followed by complete cure at higher temperature (T>80°). To further control the shrinkage, the connector is cast into a plastic frame, which was predrilled with holes around its periphery. When the elastomer is poured into this frame a physical locking of the elastomer to the frame takes place which both holds the elastomer/connector to the frame and minimizes the shrinkage. To improve the compliance and reduce the dielectric constant of the elastomer material, a foam agent can be blended into the commercial elastomeric material at a ratio ranging from 10 to 60%. Also, foam can be employed as a distinct layer.

Among the many commercially available elastomers, such as ECCOSIL and SYLGARD, the use of polydimethylsiloxane based rubbers best satisfy both the material and processing requirements. However, the thermal stability of such elastomers is limited at temperatures below 200° C. and significant outgassing is observed above 100° C. We have found that the thermal stability can be significantly enhanced by the incorporation of 25 wt % or more diphenylsiloxane (FIG. 17). Further, enhancement in the thermal stability has been demonstrated by increasing the molecular weight of the resins (oligomers) or minimizing the crosslink junction. The outgassing of the elastomers can be minimized at temperatures below 300° C. by first using a thermally transient catalyst in the resin synthesis and secondly subjecting the resin to a thin film distillation to remove low molecular weight sideproducts. For our experiments, we have found that 25 wt % diphenylsiloxane is optimal, balancing the desired thermal stability with the increased viscosity associated with diphenylsiloxane incorporation. The optimum number average molecular weight of the resin for maximum thermal stability was found to be between 18,000 and 35,000 g/mol. Higher molecular weights were difficult to cure and too viscous, once filled, to process. Network formation was achieved by a standard hydrosilylation polymerization using a hindered platinum catalyst in a reactive silicon oil carrier.

In FIG. 27 when bond head 2168 bonds the wire 2170 to the surface 2164 of substrate 2160 there is formed a flattened spherical end shown as 2204 in FIG. 35. The protuberances 2162 on substrate 2160 as shown in FIG. 27 result in grooves in the elastomer such as grooves 2116 shown in FIG. 23. These grooves form alignment features. The design and tolerances used to form the copper substrate 2160 are preferably carefully matched with the design and tolerances used to fabricate the alignment features on the substrates 294 and 296 shown in FIG. 22. Alternatively, on a substantially flat substrate, an alignment frame, such as shown in FIG. 25, can be disposed on the surface of a substrate, such as 294 and 296, of FIG. 22 and the elasticon interposer with grooves can be disposed onto this alignment frame so that the alignment grooves of the interposer engage the frame pattern as described herein above with respect to FIGS. 25 and 26.

Figure 36:
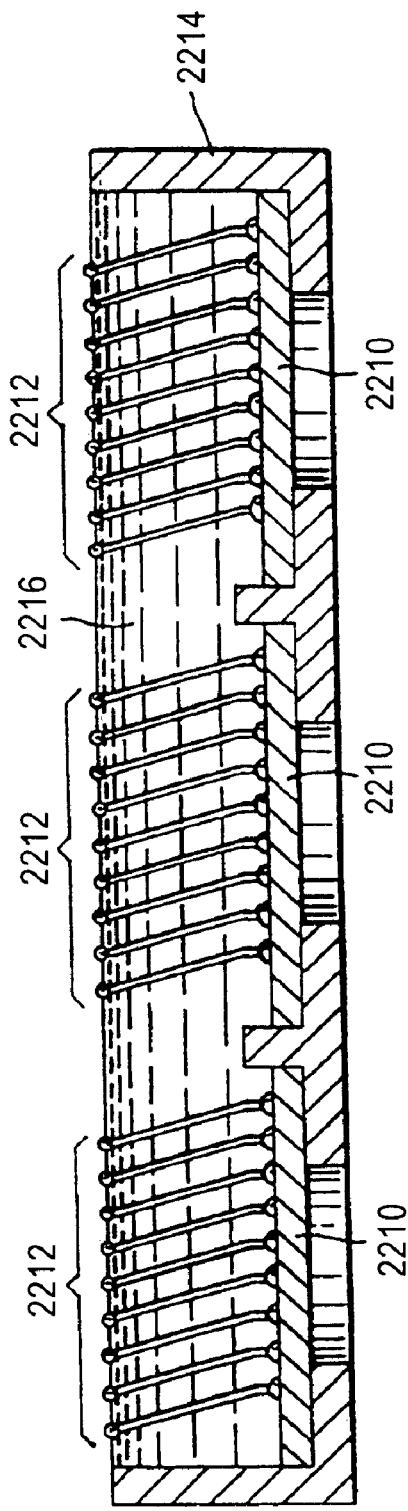
FIGS. 36 and 37 show an alternate embodiment of some of the method steps for fabricating an electrical interconnection means.
Figure 37:
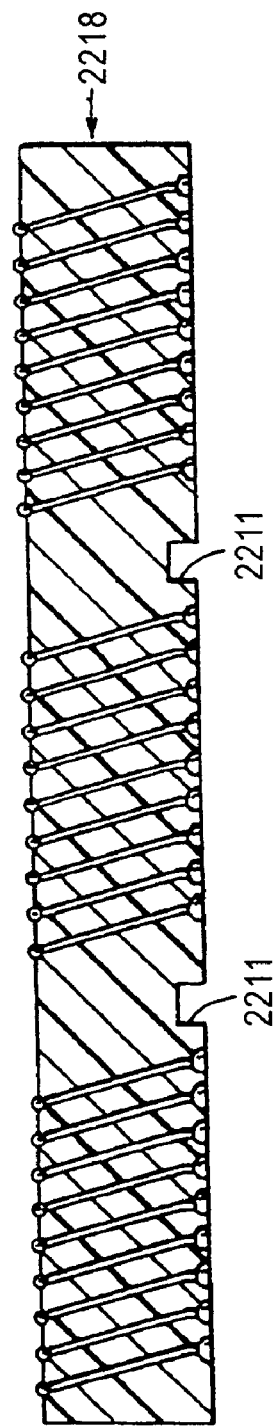

Referring to FIG. 36, multiple substrates 2210 each having a group of wires 2212 disposed thereon can be placed into a common mold 2214 into which the liquid elastomer 2216 as described herein above is disposed and cured. The cured elastomer links the substrates together into a single interposer 2218 as shown in FIG. 37. Grooves 2211 are for compliance or alignment requirements. Alternatively, several smaller connectors can be fabricated on the same substrate as a single unit and then separated after the elastomer is cured and the substrate is etched away.

Also, the surface of the copper sacrificial substrate can be textured or embossed prior to gold plating and wire bonding to provide a textured or raised contact surface on the bottom of the ball bonds. The completed interposer 2218 of FIG. 37 can be further modified by using a laser to scribe channels in the elastomeric material between the bond wires at an angle matching the angle of the bond wires, as shown in FIG. 23. The criss-crossing channels create independent elastomeric columns (shown in FIG. 26 as 2138) surrounding the gold wires. This would allow individual wires or groups of wires to compress independently and allow the interposer to compensate for slight variations in the remaining surfaces while reducing the total pressure required to compress the entire interposer. Patterned connectors can easily be fabricated by programming the wire bonder to a specific pattern and molding the elastomer to provide holes or open areas in the connector that correspond with other electronic or mechanical components surrounding the connector.

To improve compliance and reduce wire deformation, grooves are preferably molded into the elastomer on both sides of the connector surfaces in both the X and Y directions or in a circular geometry. The width and depth of the grooves are preferably wider than 5 mils and deeper than 10 mils, respectively, in an interposer 100 mils thick. The grooves are preferably molded in a direction parallel to the angled wire.

Grooves have been fabricated with laser, electron beam, metal mask and slicing with a blade. Other techniques such as stamping, injection molding and other known techniques to create the desired geometry would also work well.

The contact balls at the end of the wires are formed using a split beam laser configuration. The end of each wire will melt and form the ball only at the point where the two beams intersect. The design is illustrated in FIG. 36 which shows light source 2300, preferably an argon-ion laser which is the source of light beam 2302 which is reflected as light beam 2304 by mirror 2306. Light beam 2304 is directed through light beam expander 2308 to form expanded light beam 2310. Expanded light beam 2310 is directed to beam splitter 2312 which splits beam 2310 into beams 2314 and 2316. Beam 2316b is reflected off mirror 2322 as light beam 2324. Beam 2314 is reflected off mirror 2318 as light beam 2320. Beam 2320 is passed through focusing lens 2328 to form focused beams 2330 which focused onto spot 2332 on the workpiece which is the end of a wire. Beam 2324 is passed through focusing lens 2334 to form focused beam 2336 which is focused onto spot 2332 on the workpiece. The workpiece is disposed on x-y table 2338. The beam is expanded before focusing to get the desired size of spot 2332.

FIG. 37 shows an enlarged view of the region of FIG. 23 enclosed in the dashed circle 2230. Element 2124 is a flattened ball shape member at the end of conductor 2112. The flattened ball shaped member 2124 was formed when conductor 2112 was wire bonded to the sacrificial copper layer as described with reference to FIG. 27. The sacrificial copper layer can be fabricated with an array of pits in the surface in the regions where the wires 2112 are bonded. These pits can have, for example, a hemispherical shape, rectangular shape, pyramidal shape or any other shape. If such an array of pits are used and the wire is bonded in the region of the pit, a protuberance such as 2128 of FIG. 36 is formed at the surface 2232 of flattened ball. This protuberance provides a projecting region to the contact formed by flattened ball 2124 which can wipe on the surface of the contact location to which the flattened ball is to be electrically connected.

While the present invention has been described with respect to preferred embodiments, numerous modifications, changes and improvements will occur to those skilled in the art without departing from the spirit and scope of the invention.

What is claimed is:

1. A method of probing an electronic component by contacting the electronic component with a plurality of flexible contact elements, the method comprising the steps of:
   providing a first substrate corresponding to an area of the electronic component to be probed, said substrate having a front surface;
   mounting and connecting a second substrate to the front surface of the first substrate, said second substrate having a plurality of flexible contact elements bonded to and extending from a surface thereof;
   urging the first substrate and the electronic component towards one another so that the flexible contact elements make contact with a surface of the electronic component;
   the flexible contact elements flex and wipe the surface of the electronic component when the flexible contacts contact the electronic components;
   the flexible contact elements substantially compliantly respond when the flexible contact elements are withdrawn from contacting the electronic component; and
   at least one of the flexible contact elements includes a protuberance at an end thereof.

2. A method according to claim 1, wherein the area is a plurality of integrated circuits on the semiconductor wafer; and the flexible contacts make contact with the plurality of die sites all at once.

3. A method of probing an electronic component by contacting the electronic component with a plurality of flexible contact elements, the method comprising the steps of:
   providing a first substrate corresponding to an area of the electronic component to be probed, said substrate having a front surface;
   mounting and connecting a second substrate to the front surface of the first substrate, said second substrate having a plurality of flexible contact elements bonded to and extending from a surface thereof;
   the flexible contact elements substantially compliantly respond when the flexible contact elements are withdrawn from contacting the electronic component;
   urging the first substrate and the electronic component towards one another so that the flexible contact elements make contact with the electronic component, and the electronic component is a printed circuit board; and
   at least one of the flexible contact elements includes a protuberance at an end thereof.

4. A method according to claim 3 where each of said plurality of flexible contact elements flex and wipe the area of the electronic component when said flexible contacts contact the electronic component; the flexible contact element substantially compliantly respond when the flexible contact element are withdrawn from contacting the electronic component.

5. A method of probing an electronic component by contacting the electronic component with a plurality of flexible contact elements, the method comprising the steps of:
   providing a first substrate corresponding to an area of the electronic component to be probed, said substrate having a front surface;
   mounting and connecting a second substrate to the front surface of the first substrate, said second substrate having a plurality of flexible contact elements bonded to and extending from a surface thereof;
   the flexible contact elements substantially compliantly respond when the flexible contact elements are withdrawn from contacting the electronic component;
   urging the first substrate and the electronic component towards one another so that the flexible contact elements make contact with the electronic component, and the electronic component is a packaging substrate; and
   at least one of the flexible contact elements includes a protuberance at an end thereof.

6. A method according to claim 5 where each of said plurality of flexible contact elements flex and wipe the area of the electronic component when said flexible contacts contact the electronic component; the flexible contact element substantially compliantly respond when the flexible contact element are withdrawn from contacting the electronic component.

7. A method of probing an electronic component by contacting the electronic component with a plurality of flexible contact elements, the method comprising the steps of:
   providing a first substrate corresponding to an area of the electronic component to be probed, said substrate having a front surface;
   mounting and connecting a second substrate to the front surface of the first substrate, said second substrate having a plurality of flexible contact elements bonded to and extending from a surface thereof;
   urging the first substrate and the electronic component towards one another so that the flexible contact elements make contact with the electronic component, and at least one of the flexible contact elements includes a protuberance at an end thereof.

8. A method according to claim 7 where each of said plurality of flexible contact elements flex and wipe the area of the electronic component when said flexible contacts contact the electronic component; the flexible contact element substantially compliantly respond when the flexible contact element are withdrawn from contacting the electronic component.

9. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic component towards one another so that the flexible contact elements make contact with the electronic component, and the flexible elements are wires disposed on the surface of the second substrate, the wires are shaped so that a free end thereof laterally moves when pressed against the area of the electronic component; and
at least one of the flexible contact elements includes a protuberance at an end thereof.

10. A method according to claim 9 where each of said plurality of flexible contact elements flex and wipe the area of the electronic component when said flexible contacts contact the electronic component; the flexible contact element substantially compliantly respond when the flexible contact element are withdrawn from contacting the electronic component.

11. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic device towards one another so that the flexible contact elements make contact with the electronic component so that a free end of the flexible contact elements laterally move when pressed against the area of the electronic device, and the second substrate is aligned to the first substrate by a socket which electrically interconnects the first substrate and the second substrate in a substantially fixed position with respect to each other.

12. A method according to claim 11 where each of said plurality of flexible contact elements flex and wipe the area of the electronic component when said flexible contacts contact the electronic component; the flexible contact element substantially compliantly respond when the flexible contact element are withdrawn from contacting the electronic component.

13. A method according to claim 11 wherein at least one of the flexible contact elements further include a protuberance at an end thereof.

14. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic component towards one another so that the flexible contact elements make contact with the electronic component so that a free end of the flexible contact elements laterally move when pressed against the area of the electronic device, and the first substrate with the second substrate mounted thereto is mounted to an electrical testing apparatus.

15. A method according to claim 14 where each of said plurality of flexible contact elements flex and wipe the area of the electronic component when said flexible contacts contact the electronic component; the flexible contact element substantially compliantly respond when the flexible contact element are withdrawn from contacting the electronic component.

16. A method according to any one of claims 1, 3, 5, 7, 9, 11, 14, or 4 to 15 wherein the flexible conductors comprise a coating.

17. A structure according to claim 16 wherein said coating is selected from the group consisting of Au, Cr, Co, Ni and Pd.

18. A structure according to claim 17 wherein said free standing flexible conductor comprises gold, gold alloy, copper, copper alloy, aluminum, nickel, palladium and platinum.

19. A method according to claim 14 wherein at least one of the flexible contact elements further includes a protuberance at an end thereof.

20. A method according to any one of claims 1, 3, 5, 7, 9, 13 or 19 wherein the protuberance comprises a surface having a portion which is substantially spherical.

21. A method according to any one of claims 1, 3, 5, 7, 9, 13 or 19 wherein the protuberance comprises a substantially planar surface.

22. A method according to any one of claims 1, 3, 5, 7, 9, 11, 14 or 4 to 15, wherein the electronic component is a semiconductor wafer.

23. A method according to any one of claims 1, 3, 5, 7, 9, 11, 14 or 4 to 15, wherein the area of the electronic component is a portion of a surface area of the electronic component.

24. A method according to any one of claims 1, 3, 5, 7, 9, 11, 14 or 4 to 15, wherein the flexible elements are probe elements.

25. A method according to any one of claims 1, 3, 5, 7, 9, 11, 14 or 4 to 15, wherein there are electrical connections between the second substrates and the first Substrate.

26. A method according to any one of claims 1, 3, 5, 7, 9, 11, 14 or 4 to 15, wherein the first substrate is a space transformer.

27. A method according to any one of claims 1, 3, 5, 7, 9, 11, 14 or 4 to 15, wherein the electronic component is a semiconductor wafer; and the flexible contact elements of the second substrate contact individual semiconductor dies on the semiconductor wafer.

28. A method according to any one of claims 1, 3, 5, 7, 9, 11, 14 or 4 to 15, wherein the electronic component is a semiconductor wafer; and the flexible contact Elements of the second substrate contacts at least one integrated circuit on the semiconductor Wafer.

29. A method according to any one of claims 1, 3, 5, 7, 9, 11, 14 or 4 to 15, wherein the first substrate with the second substrate mounted thereto is mounted to an Electrical testing apparatus by a plurality of electrical connections.

30. A method according to any one of claims 1, 3, 5, 7, 9, 11, 14 or 4 to 15, wherein there is at least one second substrate is mounted to said first substrate.

31. A method of probing an electronic component by contacting the electronic device with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
urging the first substrate and the electronic component towards one another so that the flexible contact elements make contact with a surface of the electronic component;
the flexible contact elements flex and wipe the surface of the electronic component when the flexible contacts contact the electronic components;
the flexible contact elements substantially compliantly respond when the flexible contact elements are withdrawn from contacting the electronic component;
the electronic component is a semiconductor wafer; and
the flexible contact elements of the second substrate contact individual semiconductor dies on the semiconductor wafer.

32. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic component towards one another so that the flexible contact elements make contact with the electronic component, and the first substrate comprises a printed circuit board; and
the electronic component is a semiconductor wafer; and
the flexible contact elements of the second substrate contact individual semiconductor dies on the semiconductor wafer.

33. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic component towards one another so that the flexible contact elements make contact with the electronic component, and the second substrate comprises is a packaging substrate; and
the electronic component is a semiconductor wafer; and
the flexible contact elements of the second substrate contact individual semiconductor dies on the semiconductor wafer.

34. A method of probing an electronic component by contacting the electronic component with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
the flexible contact elements substantially compliantly respond when the flexible contact elements are withdrawn from contacting the electronic component;
urging the first substrate and the electronic component towards one another so that the flexible contact elements make contact with the electronic component, and the flexible elements are wires disposed on the surface of the second substrate, the wires are shaped so that a free end thereof laterally moves when pressed against the area of the electronic component; and
the electronic component is a semiconductor wafer; and
the flexible contact elements of the second substrate contact individual semiconductor dies on the semiconductor wafer.

35. A method according to any one of claims 31 to 33 or 34 where each of said plurality of flexible contact elements flex and wipe the area of the electronic component when said flexible contacts contact the electronic component; the flexible contact element substantially compliantly respond when the flexible contact element are withdrawn from contacting the electronic component.

36. A method of probing an electronic component by contacting the electronic device with a plurality of flexible contact elements, the method comprising the steps of:
providing a first substrate corresponding to an area of the electronic component to be probed, said substrate having a front surface;
mounting and connecting a second substrate to the front surface of the first substrate, said second substrate having a plurality of flexible contact elements bonded to and extending from a surface thereof;
urging the first substrate and the electronic component towards one another so that the flexible contact elements make contact with a surface of the electronic component;
the flexible contact elements flex and wipe the surface of the electronic component when the flexible contacts contact the electronic components;
the flexible contact elements substantially compliantly respond when the flexible contact elements are withdrawn from contacting the electronic component; and
the electronic component is a semiconductor wafer; and
the flexible contact elements of the second substrate contacts at least one integrated circuit on the semiconductor wafer.

37. A method of probing an electronic component by contacting the electronic component with a plurality of flexible contact elements, the method comprising the steps of:
- providing a first substrate corresponding to an area of the electronic component to be probed, said substrate having a front surface;
- mounting and connecting a second substrate to the front surface of the first substrate, said second substrate having a plurality of flexible contact elements bonded to and extending from a surface thereof;
- the flexible contact elements substantially compliantly respond when the flexible contact elements are withdrawn from contacting the electronic component;
- urging the first substrate and the electronic component towards one another so that the flexible contact elements make contact with the electronic component, and the first substrate comprises a printed circuit board; and
- the electronic component is a semiconductor wafer; and the flexible contact elements of the second substrate contacts at least one integrated circuit on the semiconductor wafer.

38. A method of probing an electronic component by contacting the electronic component with a plurality of flexible contact elements, the method comprising the steps of:
- providing a first substrate corresponding to an area of the electronic component to be probed, said substrate having a front surface;
- mounting and connecting a second substrate to the front surface of the first substrate, said second substrate having a plurality of flexible contact elements bonded to and extending from a surface thereof;
- the flexible contact elements substantially compliantly respond when the flexible contact elements are withdrawn from contacting the electronic component;
- urging the first substrate and the electronic component towards one another so that the flexible contact elements make contact with the electronic component, and the second substrate comprises is a packaging substrate; and
- the electronic component is a semiconductor wafer; and the flexible contact elements of the second substrate contacts at least one integrated circuit on the semiconductor wafer.

39. A method of probing an electronic component by contacting the electronic component with a plurality of flexible contact elements, the method comprising the steps of:
- providing a first substrate corresponding to an area of the electronic component to be probed, said substrate having a front surface;
- mounting and connecting a second substrate to the front surface of the first substrate, said second substrate having a plurality of flexible contact elements bonded to and extending from a surface thereof;
- the flexible contact elements substantially compliantly respond when the flexible contact elements are withdrawn from contacting the electronic component;
- urging the first substrate and the electronic component towards one another so that the flexible contact elements make contact with the electronic component, and the flexible elements are wires disposed on the surface of the second substrate, the wires are shaped so that a free end thereof laterally moves when pressed against the area of the electronic component; and
- the electronic component is a semiconductor wafer; and the flexible contact elements of the second substrate contacts at least one integrated circuit on the semiconductor wafer.

40. A method according to any one of claims 36 to 38 or 39 where each of said plurality of flexible contact elements flex and wipe the area of the electronic component when said flexible contacts contact the electronic component; the flexible contact element substantially compliantly respond when the flexible contact element are withdrawn from contacting the electronic component.

* * * * *